United States Patent
Kim et al.

(10) Patent No.: US 10,567,124 B2
(45) Date of Patent: Feb. 18, 2020

(54) SERIAL COMMUNICATION INTERFACE CIRCUIT PERFORMING EXTERNAL LOOPBACK TEST AND ELECTRICAL DEVICE INCLUDING THE SAME

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Sung-Ha Kim, Yongin-si (KR); Jung-Hoon Chun, Suwon-si (KR)

(73) Assignees: SAMSUNG ELECTRONICS CO., LTD., Suwon-si (KR); RESEARCH & BUSINESS FOUNDATION OF SUNGKYUNKWAN UNIVERSITY, Suwon-si (KR)

( * ) Notice: Subject to any disclaimer, the term of this patent is extended or adjusted under 35 U.S.C. 154(b) by 47 days.

(21) Appl. No.: 15/867,034

(22) Filed: Jan. 10, 2018

(65) Prior Publication Data

US 2018/0359060 A1 Dec. 13, 2018

(30) Foreign Application Priority Data

Jun. 8, 2017 (KR) .................. 10-2017-0071728

(51) Int. Cl.
*H04L 1/24* (2006.01)
*H03M 9/00* (2006.01)
(Continued)

(52) U.S. Cl.
CPC .............. *H04L 1/24* (2013.01); *G06F 11/221* (2013.01); *G06F 11/267* (2013.01); *G06F 11/2733* (2013.01); *H03M 9/00* (2013.01)

(58) Field of Classification Search
CPC .. G06F 11/2733; G06F 11/221; G06F 11/267; G06F 13/4022; G06F 13/4282; H04L 1/24
See application file for complete search history.

(56) References Cited

U.S. PATENT DOCUMENTS 5,586,123 A * 12/1996 Baker .................... G06F 3/023
714/712
5,701,306 A * 12/1997 Arai ................. G01R 31/31724
714/724

(Continued)

FOREIGN PATENT DOCUMENTS

KR 10-2004-0041783 A 5/2004

OTHER PUBLICATIONS

"UFS-Based MCP (uMCP)", Micron Technology Inc, retrieved on Jan. 3, 2018, URL: https://www.micron.com/products/multichippackages/ufs-based-mcp, (2 pages total)—Known Prior Art.

*Primary Examiner* — Mewale A Ambaye
(74) *Attorney, Agent, or Firm* — Sughrue Mion, PLLC

(57) ABSTRACT

A serial communication interface circuit includes a transmitter configured to convert first parallel data into first serial data and transmit the first serial data through an output port; a receiver configured to receive second serial data through an input port and convert the second serial data into second parallel data; a test controller configured to generate at least one test control signal; and an embedded external loopback circuit configured to form an external loopback path between the output port and the input port to receive the first serial data and output the second serial data according to at least one channel model in response to the at least one test control signal in a test mode.

20 Claims, 21 Drawing Sheets

(51) Int. Cl.
*G06F 11/273* (2006.01)
*G06F 11/22* (2006.01)
*G06F 11/267* (2006.01)

(56) References Cited

U.S. PATENT DOCUMENTS

| | | | |
|---|---|---|---|
| 5,774,476 A * | 6/1998 | Pressly | G01R 31/31858 |
| | | | 714/726 |
| 7,992,058 B2 | 8/2011 | Maroni et al. | |
| 8,386,867 B2 | 2/2013 | Sul et al. | |
| 8,559,492 B2 | 10/2013 | Shin | |
| 8,943,256 B1 * | 1/2015 | Landry | G06F 13/404 |
| | | | 710/300 |
| 9,548,809 B1 | 1/2017 | Nagarajan | |
| 2007/0115743 A1 * | 5/2007 | Sartori | G06F 13/4282 |
| | | | 365/221 |
| 2012/0012842 A1 | 1/2012 | Kikuchi | |

\* cited by examiner

SERIAL COMMUNICATION INTERFACE CIRCUIT PERFORMING EXTERNAL LOOPBACK TEST AND ELECTRICAL DEVICE INCLUDING THE SAME

CROSS-REFERENCE TO THE RELATED APPLICATION

This application claims priority from Korean Patent Application No. 10-2017-0071728, filed on Jun. 8, 2017 in the Korean Intellectual Property Office, the disclosure of which is incorporated herein in its entirety by reference.

BACKGROUND

Apparatuses and methods consistent with the exemplary embodiments of the inventive concept relate to a serial communication interface, and more particularly, to a device and a method of testing a serial communication interface circuit.

A test of a circuit serial communication interface of a device having data transmission and reception functions may include an internal loopback test without a test through an analog signal path and an external loopback test through the analog signal path. As a communication speed of the serial communication interface increases, the test of the serial communication interface may not cover a maximum communication speed of the serial communication interface.

SUMMARY

The inventive concept provides a device and a method of testing a high speed serial communication interface circuit with an improved coverage in a serial communication interface.

According to an aspect of an exemplary embodiment, there is provided a serial communication interface circuit including a transmitter configured to convert first parallel data into first serial data and transmit the first serial data through an output port; a receiver configured to receive second serial data through an input port and convert the second serial data into second parallel data; a test controller configured to generate at least one test control signal; and an embedded external loopback circuit configured to form an external loopback path between the output port and the input port to receive the first serial data and output the second serial data according to at least one channel model in response to the at least one test control signal in a test mode.

According to an aspect of an exemplary embodiment, there is provided an electronic device including at least one serial communication interface circuit; and a controller configured to provide a test setup signal to the at least one serial communication interface circuit in order to test the at least one serial communication interface circuit according to a serial communication requirement of the at least one serial communication interface, wherein the at least one serial communication interface circuit includes: an output port configured to output first serial data; an input port configured to receive second serial data; a test controller configured to generate at least one test control signal in response to the test setup signal; and an embedded external loopback circuit configured to form an external loopback path between the output port and the input port to receive the first serial data and output the second serial data according to at least one channel model in response to the at least one test control signal in a test mode.

According to another aspect of the inventive concept, there is provided a serial communication interface circuit including a digital circuit region configured to output at least one test control signal in a test mode of the serial communication interface circuit; and an analog circuit region including an output port which transmits first serial data, an input port which receives second serial data, and an embedded external loopback circuit connected between the output port and the input port, wherein the embedded external loopback circuit receives the first serial data in the test mode and outputs an attenuated signal from a signal of the first serial data as the second serial data based on the at least one test control signal.

BRIEF DESCRIPTION OF THE DRAWINGS

The exemplary embodiments of the inventive concept will be more clearly understood from the following detailed description taken in conjunction with the accompanying drawings, in which.

DETAILED DESCRIPTION OF THE EXEMPLARY EMBODIMENTS

Figure 1:
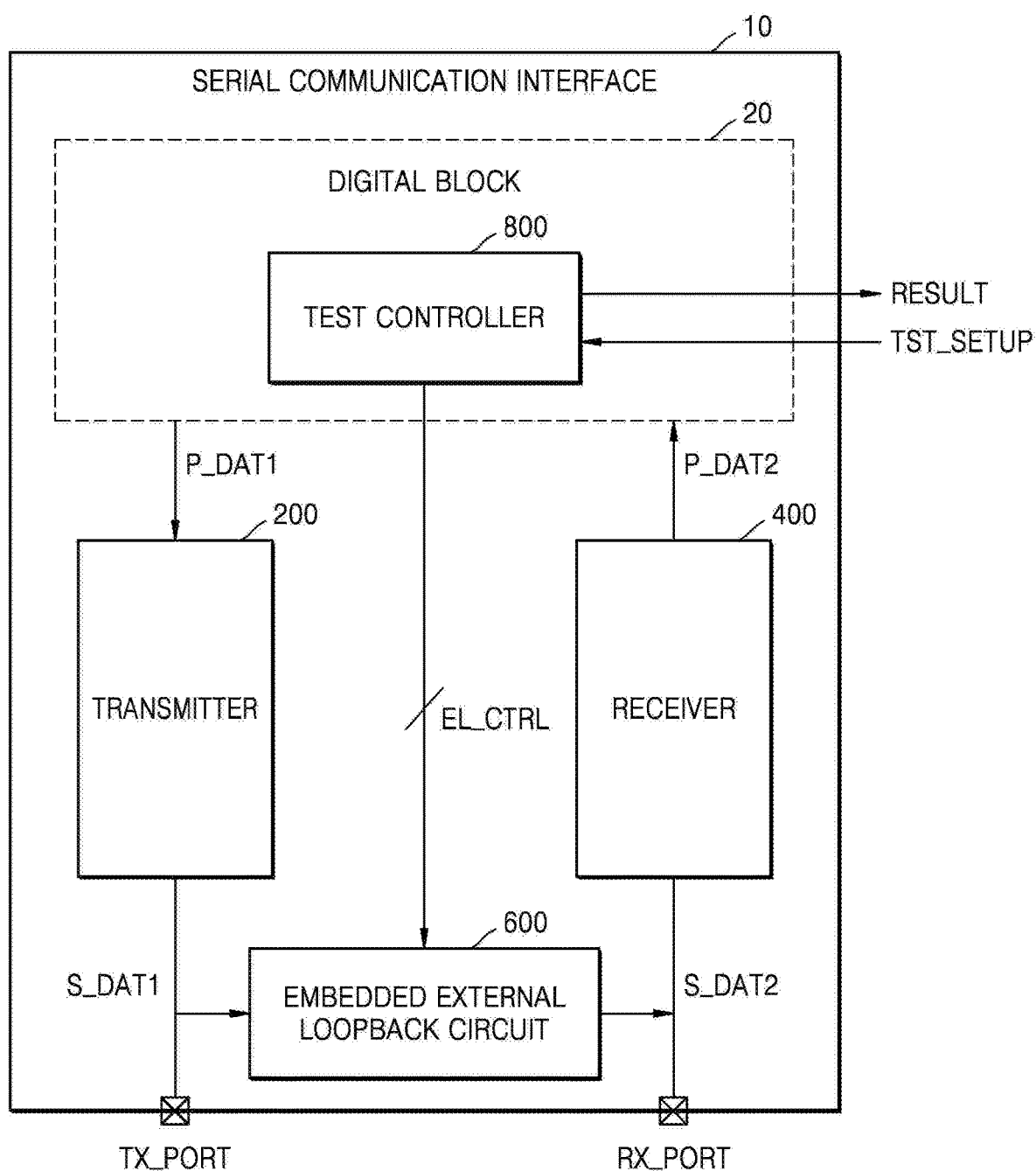
FIG. 1 illustrates a serial communication interface circuit according to an exemplary embodiment.
Figure 2:
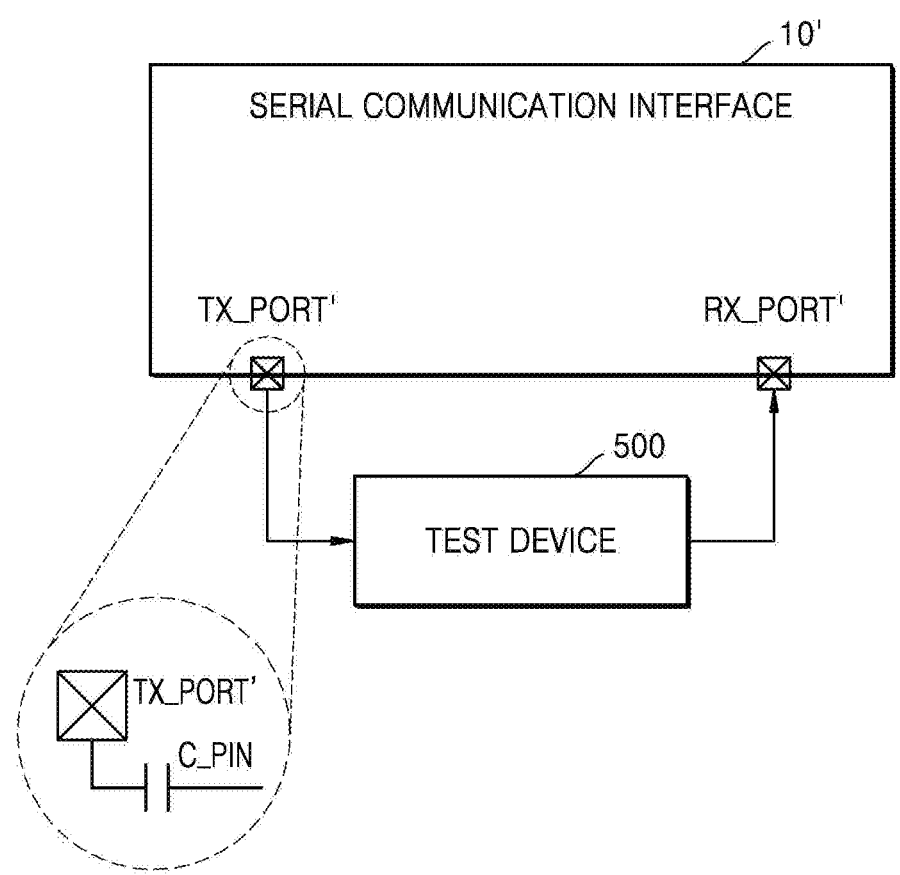
FIG. 2 is a block diagram of a serial communication interface circuit for performing an external loopback test through a test device according to a comparison example.

FIG. 1 shows a serial communication interface circuit 10 according to an exemplary embodiment. FIG. 2 is a block diagram of a serial communication interface circuit 10' for performing an external loopback test through a test device 500 according to a comparison example. A serial communication interface that is an interface that transmits and receives data in a series of bitstream may be a high speed serial interface (HSSI) for transmitting and receiving data at a high speed, for example, PCI Express (PCIe), serial ATA (SATA), Universal Flash Storage (UFS), and the like.

Referring to FIG. 1, the serial communication interface circuit 10 may include a transmitter 200, a receiver 400, an embedded external loopback circuit 600, and a test controller 800. The serial communication interface circuit 10 may include a digital block 20. The digital block 20 may include the test controller 800. The digital block 20 may transmit first parallel data P_DAT1 in a parallel data format to the transmitter 200 and receive second parallel data P_DAT2 in a parallel data format from the receiver 400.

The transmitter 200 may receive the first parallel data P_DAT1 from the digital block 20, convert the first parallel data P_DAT1 into first serial data S_DAT1 in a serial data format, and transmit the first serial data S_DAT1 through an output port TX_PORT. The receiver 400 may receive second serial data S_DAT2 in a serial data format through an input port RX_PORT, and convert the second serial data S_DAT2 into second parallel data P_DAT2.

The serial communication interface circuit 10 may operate in various modes including a normal mode and a test mode. In the normal mode, the serial communication interface circuit 10 may perform a normal serial communication operation. In the normal mode, the first parallel data P_DAT1 and the first serial data S_DAT1 may be referred to as transmitting normal mode data, and the second parallel data P_DAT2 and the second serial data S_DAT2 may be referred to as receiving normal mode data. The test mode may be a mode for testing the serial communication interface circuit 10. The serial communication interface circuit 10 may be set to the test mode in an electrical die sorting (EDS) step, and may be set to the test mode even after packaging is completed. In the test mode, the serial communication interface circuit 10 may form an internal loopback path that does not include outside the transmitter 200 and the receiver 400, i.e., an analog signal path, and may form an external loopback path that includes outside the transmitter 200 and the receiver 400, i.e., the analog signal path.

Referring to FIG. 2, a signal output through an output port TX_PORT' of the serial communication interface circuit 10' may be transmitted through the test device 500 outside the serial communication interface circuit 10', and may be input to an input port RX_PORT' of the serial communication interface circuit 10'. A test may be performed on the serial communication interface circuit 10' through this path.

As shown in FIG. 2, a pin capacitor C_PIN may be in a pin portion where the output port TX_PORT' of the serial communication interface circuit 10' is connected to an external circuit. Although not shown in FIG. 2, the input port RX_PORT' of the serial communication interface circuit 10' may also have a pin capacitor in the pin portion connected to an external circuit. The pin capacitor C_PIN may distort a signal transferred during a test process, which may make it difficult to proceed with the test on the serial communication interface circuit 10' at an at-speed. As a result, a low test coverage problem may occur.

Referring to FIG. 1, the serial communication interface circuit 10 according to an exemplary embodiment may include the embedded external loopback circuit 600 that forms the external loopback path. The embedded external loopback circuit 600 may be between the output port TX_PORT of the transmitter 200 and the input port RX_PORT of the receiver 400 to form the external loopback path. The embedded external loopback circuit 600 may be set to the test mode or the normal mode based on at least one test control signal EL_CTRL, may form a path of an electrical signal between the output port TX_PORT and the input port RX_PORT in the test mode, and may block a path of an electrical signal between the output port TX_PORT and the input port RX_PORT in the normal mode. Also, in the test mode, the embedded external loopback circuit 600 may provide various channel models to the external loopback path based on the at least one test control signal EL_CTRL, as described below.

The test controller 800 may generate the at least one test control signal EL_CTRL in response to a test setup signal TST_SETUP received from the outside of the serial communication interface circuit 10 in the test mode, and may transfer the at least one test control signal EL_CTRL to the embedded external loopback circuit 600. The test setup signal TST_SETUP may control the test controller 800 so that an appropriate test may proceed according to a serial communication requirement required for the serial communication interface circuit 10. The test controller 800 may output a final result signal RESULT indicating a result of the test in the test mode to the outside of the serial communication interface circuit 10.

The transmitter 200, the receiver 400, the test controller 800, and the embedded external loopback circuit 600 may be included in a single chip.

Figure 3:
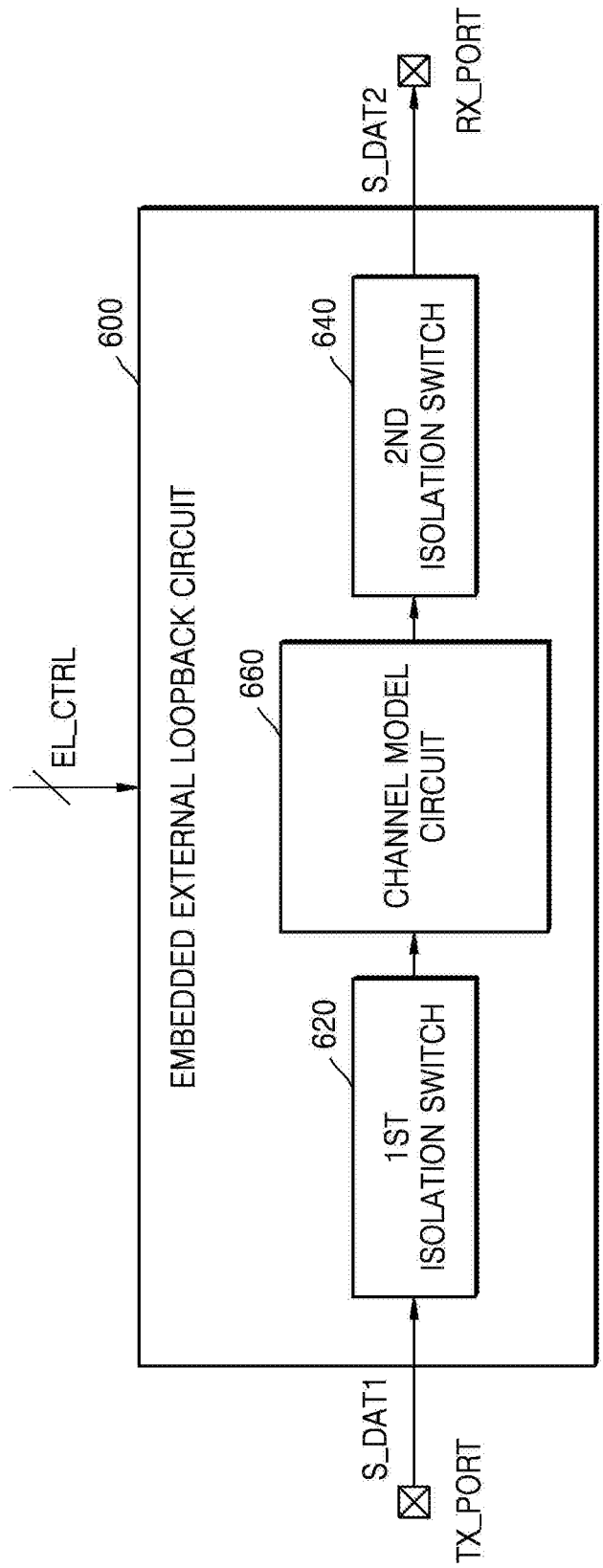
FIG. 3 is an exemplary block diagram of an embedded external loopback circuit of FIG. 1 according to an exemplary embodiment.

FIG. 3 is an exemplary block diagram of the embedded external loopback circuit 600 of FIG. 1 according to an exemplary embodiment. As described with reference to FIG. 1, the embedded external loopback circuit 600 may receive the first serial data S_DAT1 of the transmitter 200 between the output port TX_PORT of the transmitter 200 and the input port RX_PORT of the receiver 400, and may output the second serial data S_DAT2.

Referring to FIG. 3, the embedded external loopback circuit 600 may include a first isolation switch 620, a second isolation switch 640, and a channel model circuit 660. The first isolation switch 620, the second isolation switch 640 and the channel model circuit 660 may be controlled based on the at least one test control signal EL_CTRL input to the embedded external loopback circuit 600. This will be described in detail below with reference to FIG. 7.

The first isolation switch 620 may be coupled to the output port TX_PORT, and may be turned on in a test mode. The second isolation switch 640 may be coupled to the input port RX_PORT, and may be turned on in the test mode. The channel model circuit 660 may provide a channel model of an external loopback path in the test mode. Specifically, the channel model circuit 660 may provide one of a plurality of channel models based on the at least one test control signal EL_CTRL. This will be described in detail below with reference to FIGS. 10A through 11B.

Figure 4:
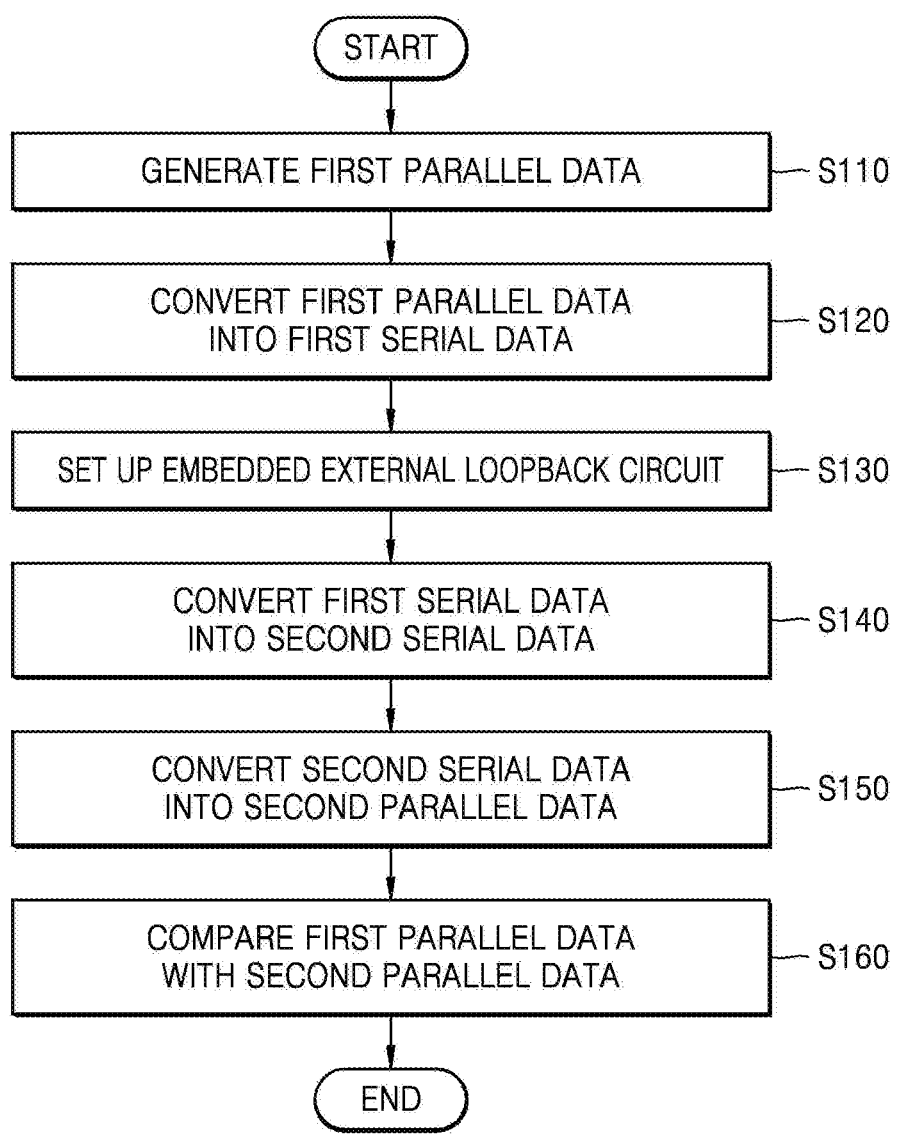
FIG. 4 is a flowchart illustrating an operation of the serial communication interface circuit of FIG. 1 to perform an external loopback test in a test mode according to an exemplary embodiment.

FIG. 4 is a flowchart illustrating an operation of the serial communication interface circuit 10 of FIG. 1 to perform an external loopback test in a test mode according to an exemplary embodiment. As shown in FIG. 4, the operation of performing the external loopback test may include step S110 of generating first parallel data P_DAT1, for example, the digital block 20 generating the first parallel data P_DAT1 for a loopback test, step S120 of converting the first parallel data P_DAT1 into the first serial data S_DAT1, for example, the digital block 20 converting the first parallel data P_DAT1 into the first serial data S_DAT1, step S130 of setting up the embedded external loopback circuit 600, for example, the test controller 800 setting up the embedded external loopback circuit 600 on the basis of the test control signal EL_CTRL, step S140 of converting the first serial data S_DAT1 into the second serial data S_DAT2, for example, converting the first serial data S_DAT1 into the second serial data S_DAT2 through the embedded external loopback circuit 600, step S150 of converting the second serial data S_DAT2 into the second parallel data P_DAT2, for example, the receiver 400 converting the first serial data S_DAT1 to the second parallel data P_DAT2, and step S160 of comparing the first parallel data P_DAT1 with the second parallel data P_DAT2, for example, the digital block 20 comparing the first parallel data P_DAT1 with the second parallel data P_DAT2.

In the exemplary embodiment shown in FIG. 4, step S130 of setting up the embedded external loopback circuit 600 may precede step S120 of converting the first parallel data P_DAT1 to the first serial data S_DAT1 and/or step S110 of generating the first parallel data P_DAT1.

Figure 5:
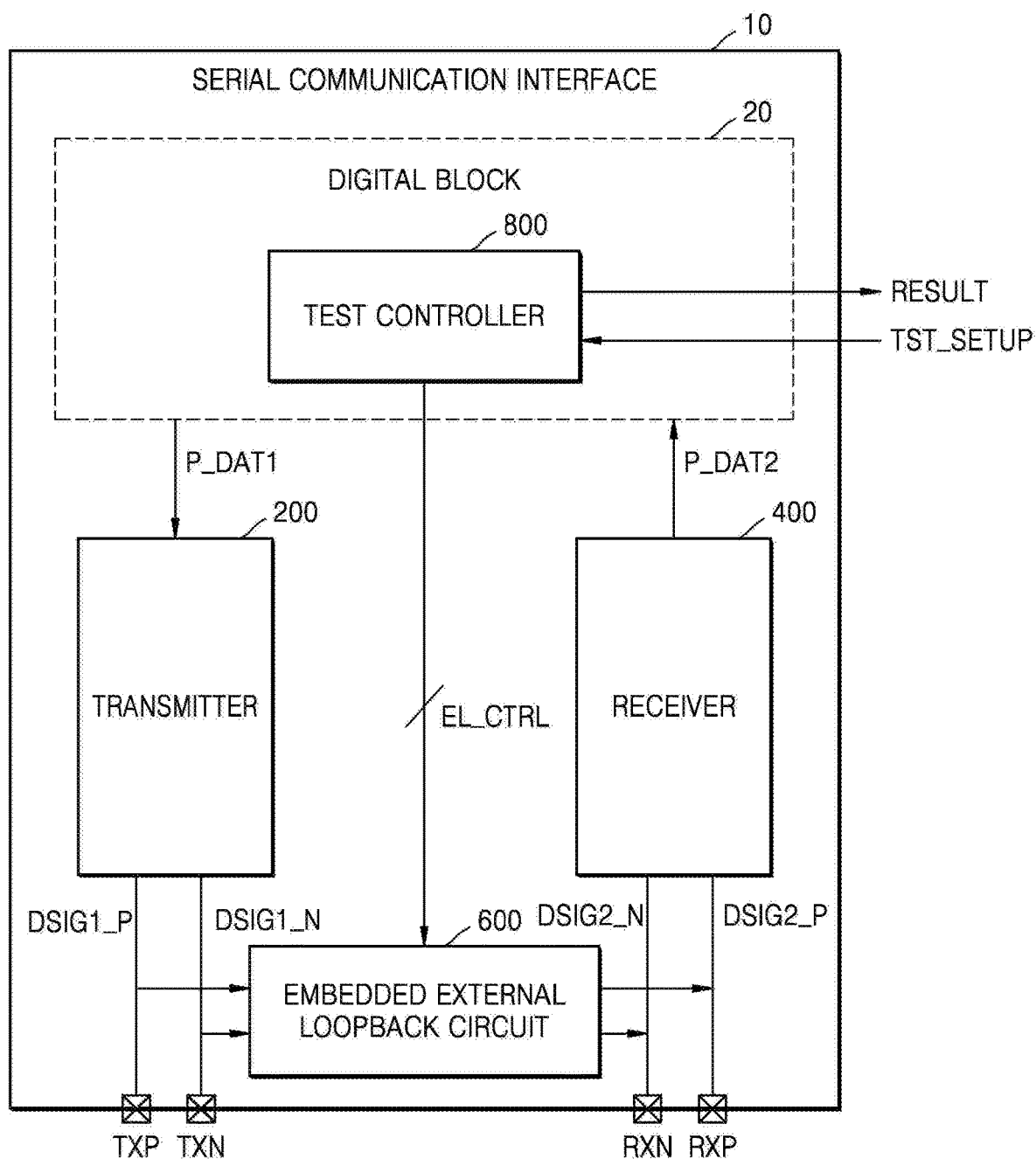
FIG. 5 illustrates a serial communication interface circuit having differential output ports and differential input ports according to an exemplary embodiment.

FIG. 5 shows the serial communication interface circuit 10 having differential output ports TXP, TXN and differential input ports RXP, RXN according to an exemplary embodiment.

The serial communication interface circuit 10 may include the transmitter 200, the receiver 400, the embedded external loopback circuit 600, and the test controller 800, similar to FIG. 1. Unlike FIG. 1, the transmitter 200 may output a differential signal, and the receiver 400 may receive a differential signal. That is, the first serial data S_DAT1 transmitted by the transmitter 200 may be serial data transmitted by first differential signals DSIG1_P and DSIG1_N, and the second serial data S_DAT2 received by the receiver 400 may be serial data received as second differential signals DSIG2_P and DSIG2_ N. To this end, the output port TX_PORT of the transmitter 200 may be the differential output ports TXP, TXN and the input port RX_ PORT of the receiver 400 may be the differential input ports RXP, RXN. Descriptions of FIG. 5 that are redundant with the description of FIG. 1 will be omitted.

The first differential signals DSIG1_ P and DSIG1_N output through the differential output ports TXP and TXN of the transmitter 200 may be complementary to each other. The second differential signals DSIG2_P and DSIG2_ N input through the differential input ports RXP and RXN of the receiver 400 may be complementary to each other.

Figure 6:
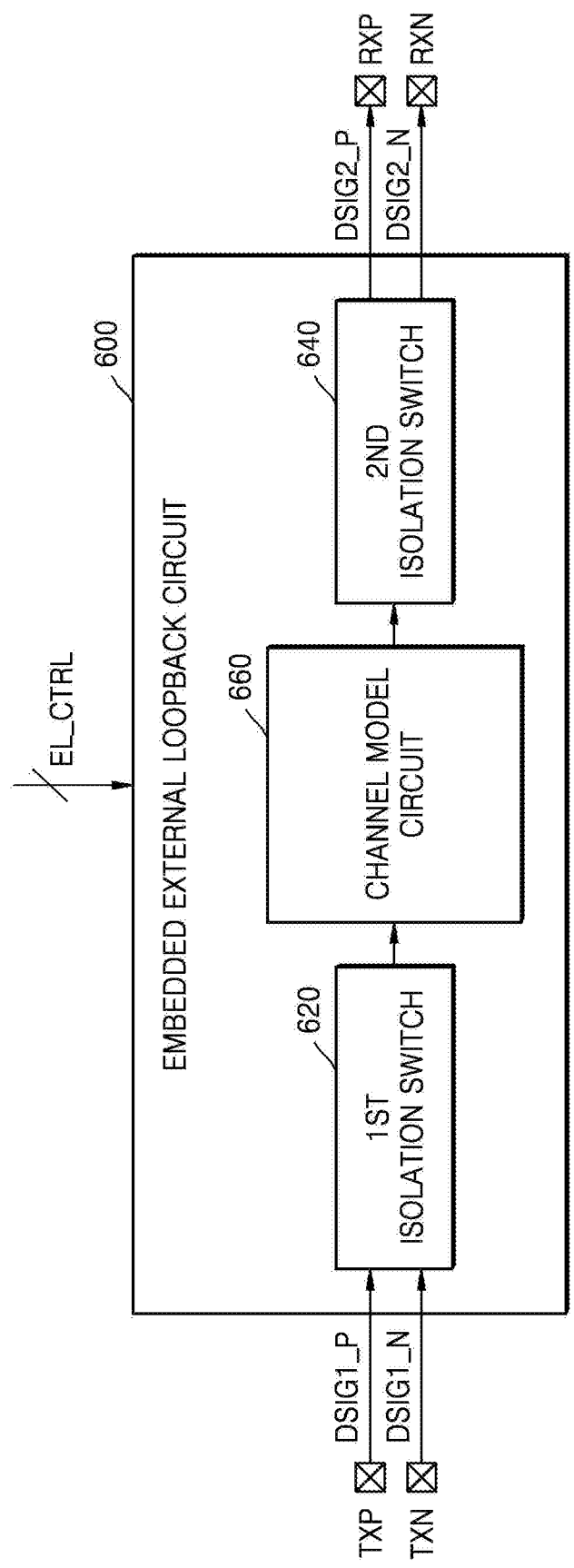
FIG. 6 is an exemplary block diagram of an embedded external loopback circuit of FIG. 5 according to an exemplary embodiment.

FIG. 6 is an exemplary block diagram of the embedded external loopback circuit 600 of FIG. 5 according to an exemplary embodiment. The embedded external loopback circuit 600 may include the first isolation switch 620, the second isolation switch 640, and the channel model circuit 660, similar to FIG. 3. Unlike FIG. 3, the first serial data S_DAT1 transmitted by the transmitter 200 may be serial data transmitted as the first differential signals DSIG1_P and DSIG1_N, and the second serial data S_DAT2 received by the receiver 400 may be serial data received as the second differential signal DSIG2_P, DSIG2_N. To this end, the output port TX_PORT of the transmitter 200 may be the differential output ports TXP, TXN, and the input port RX_PORT of the receiver 400 may be the differential input ports RXP, RXN. The embedded external loopback circuit 600 of FIG. 6 may form an external loopback path that includes a channel model having a symmetric structure on both signal lines of a differential signal.

Figure 7:
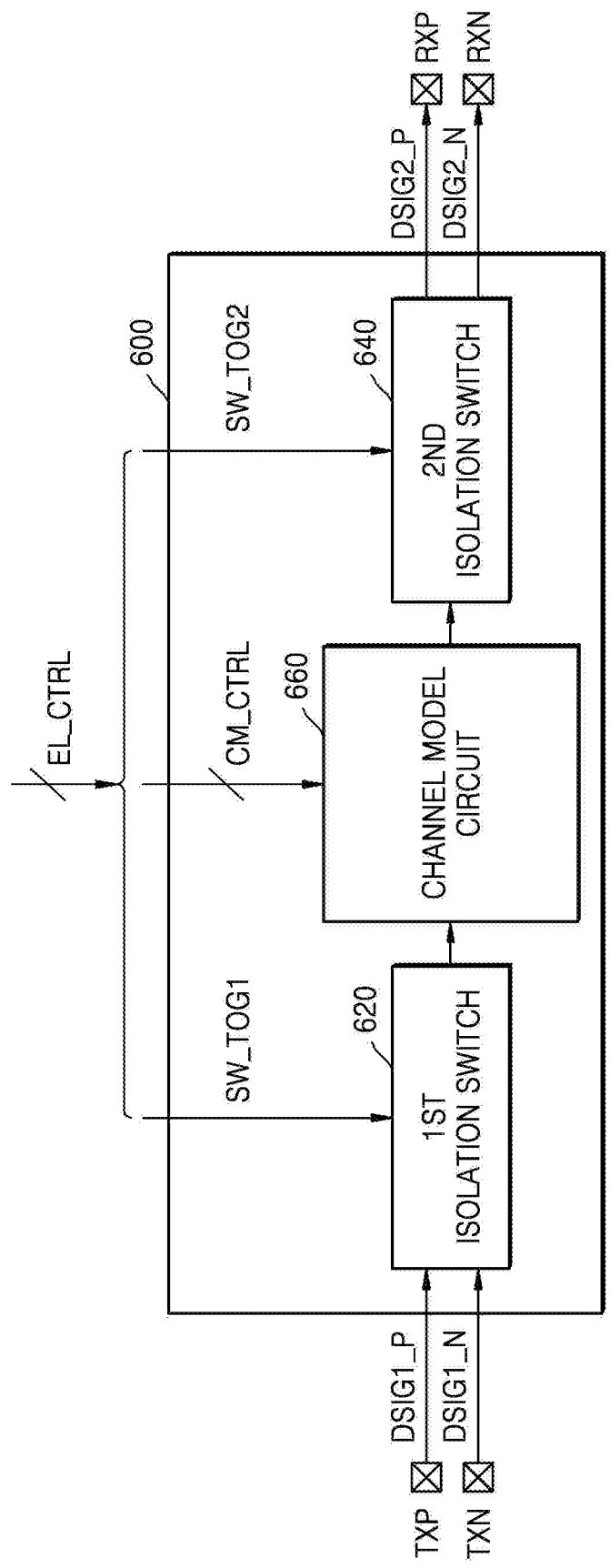
FIG. 7 illustrates a specific operation in which the embedded external loopback circuit of FIG. 6 is controlled by a test control signal according to an exemplary embodiment.

FIG. 7 illustrates a specific operation in which the embedded external loopback circuit 600 of FIG. 6 is controlled by the test control signal EL_CTRL according to an exemplary embodiment. As described with reference to FIGS. 3 and 6, the first isolation switch 620, the second isolation switch 640, and the channel model circuit 660 of the embedded external loopback circuit 600 may be controlled by the at least one test control signal EL_CTRL input to the embedded external loopback circuit 600. The test control signal EL_CTRL may include a first switch toggle signal SW_TOG1, a second switch toggle signal SW_TOG2, and a channel model control signal CM_CTRL, as shown in FIG. 7.

Specifically, the first switch toggle signal SW_TOG1 may connect the channel model circuit 660 to the differential output ports TXP and TXN by turning on the first isolation switch 620 in a test mode, and may release a connection between the channel model circuit 660 and the differential output ports TXP and TXN by turning off the first isolation switch 620 in a normal mode.

Similarly, the second switch toggle signal SW_TOG2 may connect the channel model circuit 660 to the differential input ports RXP and RXN by turning on the second isolation switch 640 in the test mode, and may release a connection between the channel model circuit 660 and the differential input ports RXP and RXN by turning off the second isolation switch 640 in the normal mode.

As described with reference to FIG. 3, the channel model circuit 660 may provide a channel model of an external loopback path in the test mode. Specifically, the channel model circuit 660 may provide one of a plurality of channel models based on the channel model control signal CM_CTRL. This will be described in detail below with reference to FIGS. 10A to 11B.

Figure 8A:
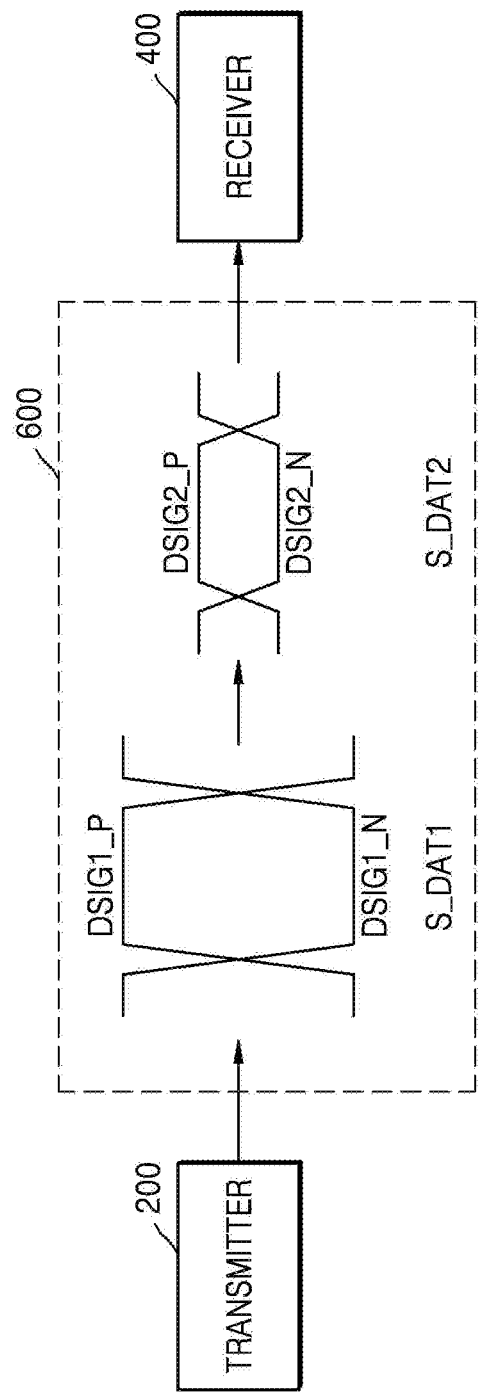
FIGS. 8A and 8B illustrate that first serial data output from a transmitter through first differential signals is provided to an embedded external loopback circuit and converted into second serial data input to a receiver through second differential signals according to exemplary embodiments.
Figure 8B:
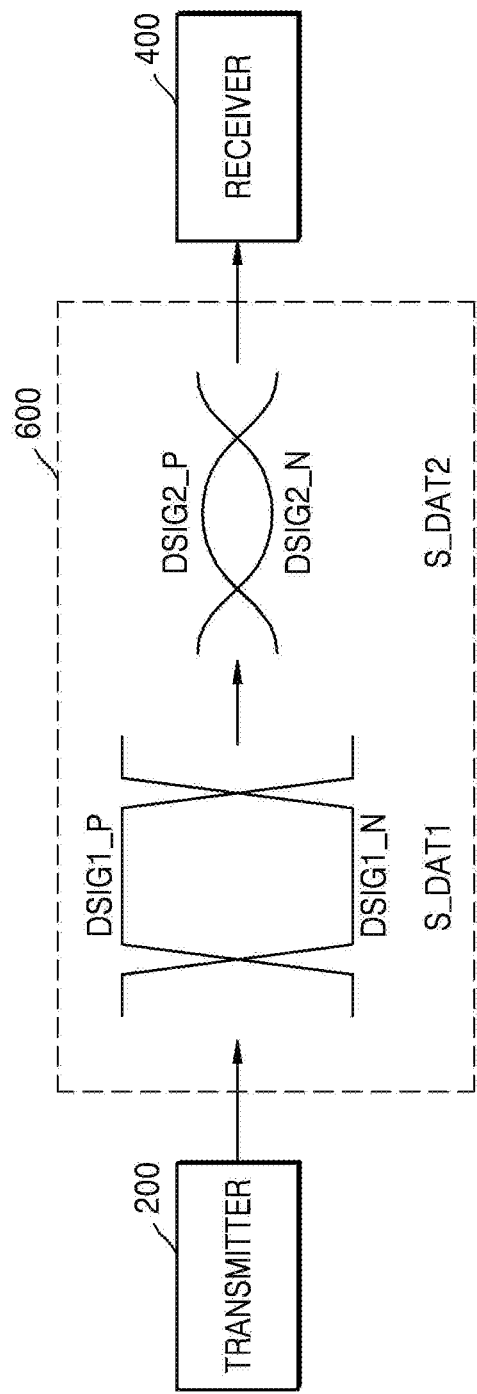

FIGS. 8A and 8B illustrate that the first serial data S_DAT1 output from the transmitter 200 as the first differential signals DSIG1_P and DSIG1_N is provided to the embedded external loopback circuit 600 and converted into the second serial data S_DAT2 input to the receiver 400 as the second differential signals DSIG2_P and DSIG_N according to exemplary embodiments.

The second differential signals DSIG2_P and DSIG2_N input to the receiver 400 may necessarily have a worst condition that the receiver 400 may process in order to test the serial communication interface circuit 10 through an external loopback path. The worst condition is called a worst eye-opening condition.

Referring to FIG. 8A, the first differential signals DSIG1_P and DSIG1_N output from the transmitter 200 may pass through the embedded external loopback circuit 600 set up according to a DC loss method in a test mode, and may be converted into the second differential signals DSIG2_P and DSIG2_ N having a reduced DC level, and thus the worst eye-opening condition may be established and a highly reliable test may be performed. To utilize the DC loss method in the external loopback test as shown in FIG. 8A, the channel model circuit 660 of the embedded external loopback circuit 600 may include a resistor, which may reduce a DC level of the first differential signals DSIG1_P and DSIG1_N according to the voltage divider principle. A specific configuration of the channel model circuit 660 for the DC loss method will be described below with reference to FIG. 10A.

Referring to FIG. 8B, the first differential signals DSIG1_P and DSIG1_N output from the transmitter 200 may pass through the embedded external loopback circuit 600 set up according to an AC loss method in the test mode, and may be converted into the second differential signals DSIG2_P, DSIG2_N that are distorted, and thus the worst eye-opening condition may be established and a highly reliable test may be performed. To utilize the AC loss method in the external loopback test, as shown in FIG. 8B, the channel model circuit 660 of the embedded external loopback circuit 600 may include a capacitor, which may distort the first differential signals DSIG1_P, DSIG1_N according to characteristics of the capacitor. A configuration of the channel model circuit 660 for the AC loss method will be described in detail below with reference to FIG. 10B.

Not only the exemplary embodiments of FIGS. 8A and 8B but also the channel model circuit 660 may combine the DC loss method disclosed in FIG. 8A and the AC loss method disclosed in FIG. 8B to reduce the DC level of the first differential signals DSIG1_P and DSIG1_N and simultaneously distort the signal, thereby establishing the worst-eye opening condition of the second differential signals DSIG2_N and DSIG2_N. In order to utilize such a method, the channel model circuit 660 of the embedded external loopback circuit 600 may include a resistor and a capacitor. A specific configuration of the channel model circuit 660 will be described in detail with reference to FIGS. 11A and 11B.

Figure 9A:
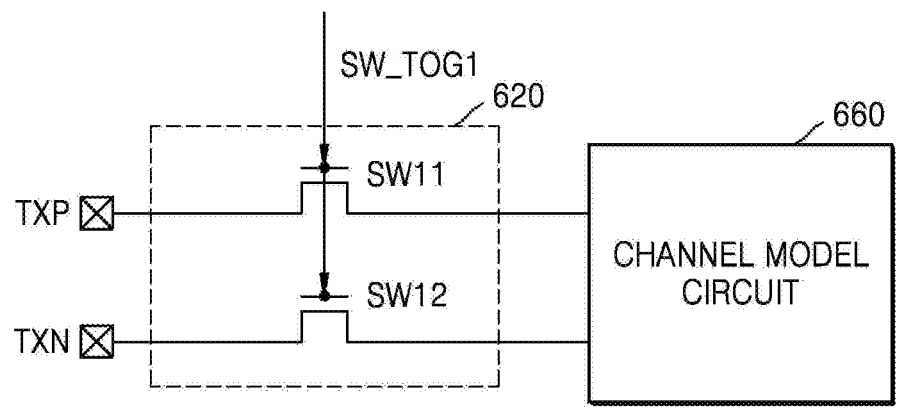
FIGS. 9A and 9B illustrate structures of a first isolation switch and a second isolation switch of FIGS. 6 and 7, respectively, according to exemplary embodiments.
Figure 9B:
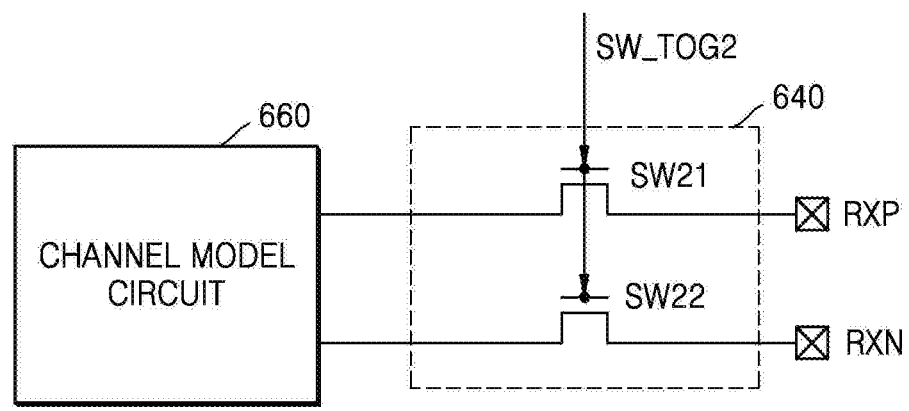

FIGS. 9A and 9B illustrate structures of the first isolation switch 620 and the second isolation switch 640 of FIGS. 6 and 7, respectively, according to exemplary embodiments.

Referring to FIG. 9A, the first isolation switch 620 may include two switches SW11 and SW12 located in each of two signal lines. Each of the switches SW11 and SW12 may determine whether to connect the channel model circuit 660 to the differential output ports TXP, TXN based on the first switch toggle signal SW_TOG1. Specifically, in a normal mode, the first switch toggle signal SW_TOG1 may turn off the switches SW11 and SW12 to open the differential output ports TXP and TXN and the channel model circuit 660, and in a test mode, may turn on the switches SW11 and SW12 to connect between the differential output ports TXP and TXN and the channel model circuit 660.

Each of the switches SW11 and SW12 may be one of transistors that function as switches such as an N-type metal oxide semiconductor field-effect transistor (N-type MOSFET), a P-type metal oxide semiconductor field-effect transistor (P-type MOSFET), an NPN Bipolar Junction Transistor (NPN BJT), a PNP bipolar Junction Transistor (PNP BJT), and the like.

Referring to FIG. 9B, the second isolation switch 640 may include two switches SW21 and SW22 located in each of two signal lines. Each of the switches SW21 and SW22 may determine whether to connect the channel model circuit 660 to the differential input ports RXP and RXN based on the second switch toggle signal SW_TOG2. Specifically, in the normal mode, the second switch toggle signal SW_TOG2 may turn off the switches SW21 and SW22 to open the differential input terminals RXP and RXN and the channel model circuit 660, and, in the test mode, may turn on the switches SW21 and SW22 to connect between the differential input ports RXP and RXN and the channel model circuit 660.

Each of the switches SW21 and SW22 may be one of transistors that function as switches such as an N-type MOSFET, a P-type MOSFET, an NPN BJT, a PNP BJT, and the like.

Figure 10A:
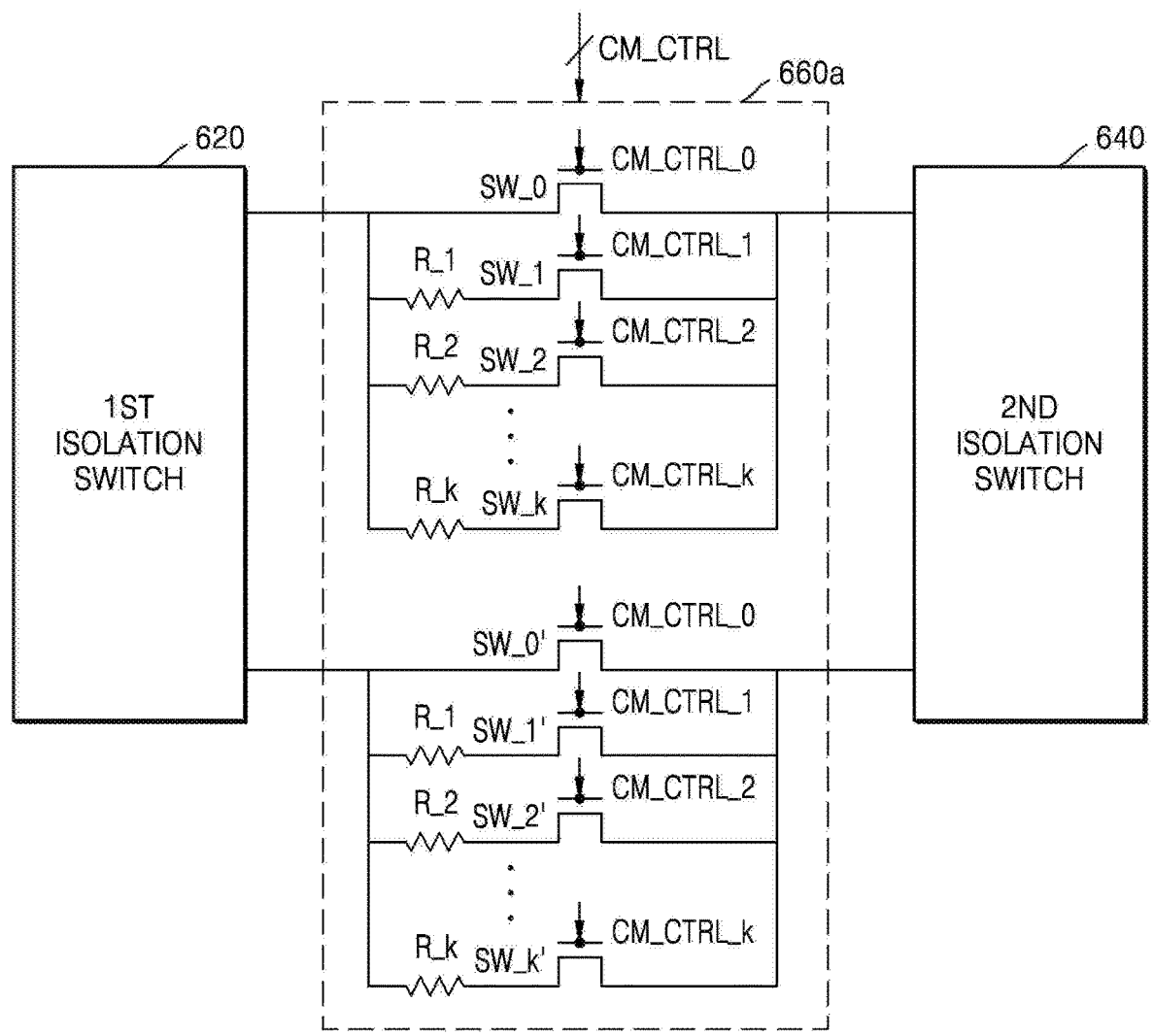
FIGS. 10A through 10B illustrate exemplary structures of a channel model circuit of FIG. 7 according to exemplary embodiments.
Figure 10B:
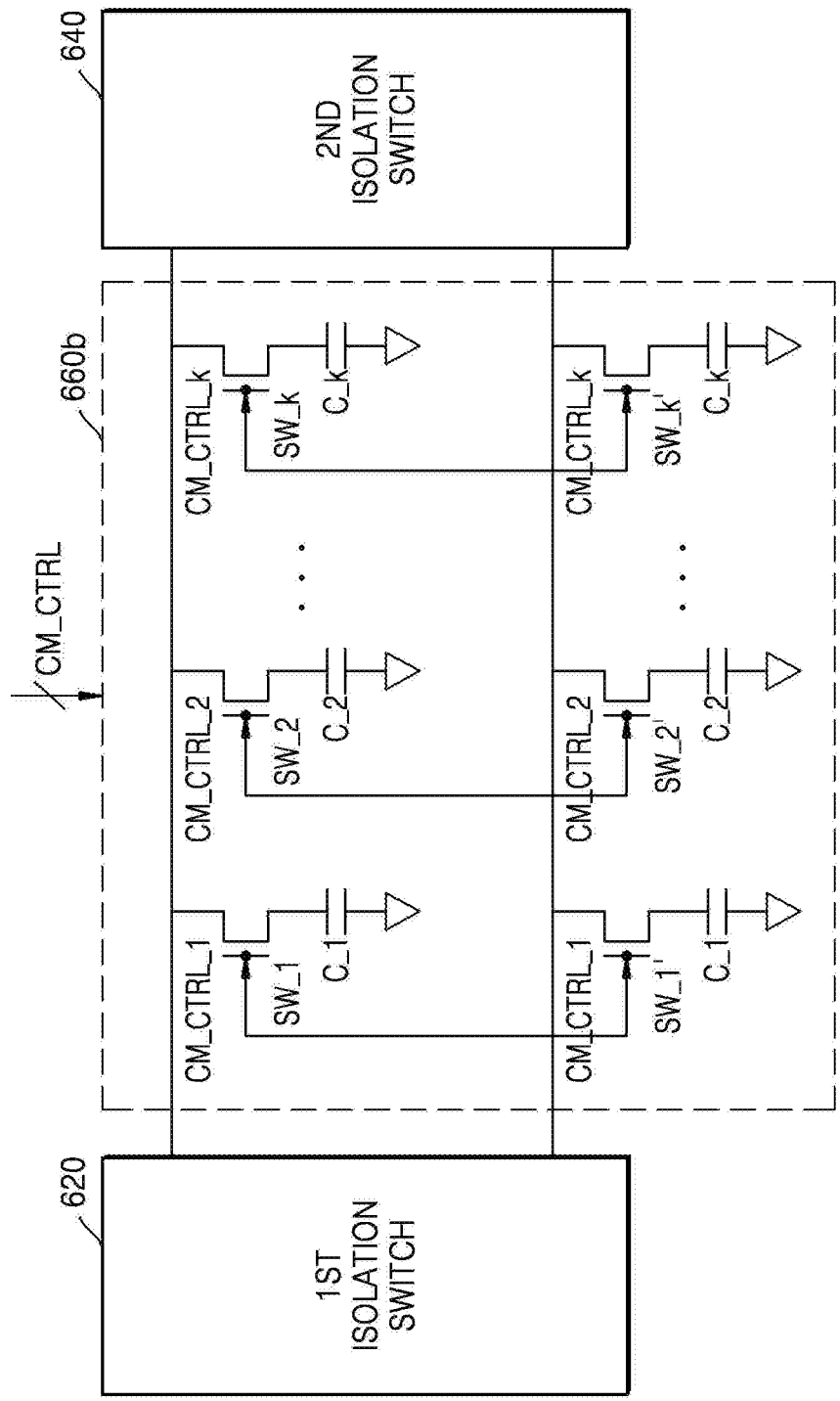

FIGS. 10A through 10B illustrate exemplary structures of the channel model circuit 660 of FIG. 7 according to exemplary embodiments. As described above with reference to FIGS. 3 and 7, the channel model circuit 660 may provide a channel model of an external loopback path in a test mode. Specifically, the channel model circuit 660 may provide one of a plurality of channel models based on the channel model control signal CM_CTRL. Referring to FIGS. 10A through 10B, the channel model circuit 660 may include a plurality of passive elements, and may include a plurality of switches respectively coupled to one end of the plurality of passive elements. The plurality of passive elements may include a resistor and/or a capacitor.

Referring to FIG. 10A, a channel model circuit 660a may include k (where k is a natural number equal to or greater than 1) resistors R_1 to R_k connected in parallel to an external loopback path of each of two signal lines, a plurality of switches SW_1 to SW_k connected to one ends of the resistors R_1 to R_k, respectively, and a switch SW_0 connected to the first and second isolation switches 620 and 640. Each of the plurality of switches SW_1 to SW_k connected to each of the resistors R_1 to R_k may include or exclude each of the resistors R_1 to R_k connected to each of the plurality of switches SW_1 to SW_k in an external loopback path according to the channel model control signal CM_CTRL. Values of the resistors R_1 to R_k connected in parallel may all be the same, may some be the same, or may all be different.

The channel model control signal CM_CTRL may include a channel model switch control signal CM_CTRL_0 that determines whether to turn on or off the switch SW_0 connected to the first and second isolation switches 620 and 640, and channel model switch control signals CM_CTRL_1 to CM_CTRL_k that determine whether to turn on or turn off the switches SW_1 to SW_k connected to one ends of the resistors R_1 to R_k, respectively. Referring to FIG. 10A, the channel model circuit 660a may form an external loopback path including a channel model having a symmetric structure on both signal lines.

To check a specific operation of the channel model, it is assumed that when a '1' signal is input to each of the switches SW_0 to SW_k as each of the channel model switch control signals CM_CTRL_0 to CM_CTRL_k, each switch is turned on, and, when a '0' signal is input instead, each switch is turned off. If 1, 0, . . . , 0 signals are respectively input to the switches SW_0 to SW_k as the channel model switch control signals CM_CTRL_0, CM_CTRL_1, . . . , CM_CTRL_k, the first isolation switch 620 and the second isolation switch 640 may be substantially connected by a conducting wire. As another example, if k is a natural number of 2 or more and 0, 1, 0, . . . , 0 signals are respectively input to the switches SW_0 to SW_k as the channel model switch control signals CM_CTRL_0, CM_CTRL_1, CM_CTRL_2, . . . , CM_CTRL_k, only the resistor R_1 may be connected between the first isolation switch 620 and the second isolation switch 640. As another example, if k is a natural number of 3 or more and 0, 1, 1, 0, . . . , 0 signals are respectively input to the switches SW_0 to SW_k as the channel model switch control signals CM_CTRL_0, CM_CTRL_1, CM_CTRL_2, CM_CTRL_3, . . . , CM_C-

TRL_k, the resistor R_1 and the resistor R_2 may be connected in parallel between the first isolation switch 620 and the second isolation switch 640. In this way, the channel model circuit 660a may provide one of the plurality of channel models through a combination of the channel model switch control signals CM_CTRL_0 to CM_CTRL_k.

Referring to FIGS. 10A and 7, the first differential signals DSIG1_P and DSIG1_N may be converted into the second differential signals DSIG2_P, DSIG2_N having a reduced DC level according to the voltage divider principle via the channel model circuit 660a according to FIG. 10A, and thus a worst eye-opening condition according to a DC loss method as shown in FIG. 8A may be established.

Referring to FIG. 10B, a channel model circuit 660b may include k (where k is a natural number greater than or equal to 1) capacitors C_1 to C_k connected to the external loopback path of each of two signal lines through the plurality of switches SW_1 to SW_k connected to one ends of the capacitors C_1 to C_k, respectively. Each of the plurality of switches SW_1 to SW_k connected to each of the capacitors C_1 to C_k may include or exclude each of the capacitors C_1 to C_k connected thereto in the external loopback path according to the channel model control signal CM_CTRL. Values of the capacitors C_1 to C_k may be the same, may be some the same, or may be all different.

The channel model control signal CM_CTRL may include the channel model switch control signals CM_CTRL_1 to CM_CTRL_k that determine whether to turn on or off the switches SW_1 to SW_k coupled to the capacitors C_1 to C_k, respectively. Referring to FIG. 10B, the channel model circuit 660b may form the external loopback path including a channel model having a symmetric structure on both signal lines.

To check a specific operation of the channel model, it is assumed that when a '1' signal is input to each of the switches SW_1 to SW_k as each of the channel model switch control signals CM_CTRL_0 to CM_CTRL_k, each switch is turned on, and, when a '0' signal is input instead, each switch is turned off. If 0, . . . , 0 signals are respectively input to the switches SW_1 to SW_k as the channel model switch control signals CM_CTRL_0, CM_CTRL_1, . . . , CM_CTRL_k, the first isolation switch 620 and the second isolation switch 640 may be substantially connected by a conducting wire. As another example, if k is a natural number of 2 or more and 1, 0, . . . , 0 signals are respectively input to the switches SW_1 to SW_k as the channel model switch control signals CM_CTRL_0, CM_CTRL_1, CM_CTRL_2, . . . , CM_CTRL_k, only the capacitor C_1 may be connected between the first isolation switch 620 and the second isolation switch 640. As another example, if k is a natural number of 3 or more and 1, 1, 0, . . . , 0 signals are respectively input to the switches SW_1 to SW_k as the channel model switch control signals CM_CTRL_0, CM_CTRL_1, CM_CTRL_2, CM_CTRL_3, . . . , CM_CTRL_k, the capacitor C_1 and the capacitor C_2 may be connected in parallel between the first isolation switch 620 and the second isolation switch 640. In this way, the channel model circuit 660b may provide one of the plurality of channel models through a combination of the channel model switch control signals CM_CTRL_0 to CM_CTRL_k.

Figure 11A:
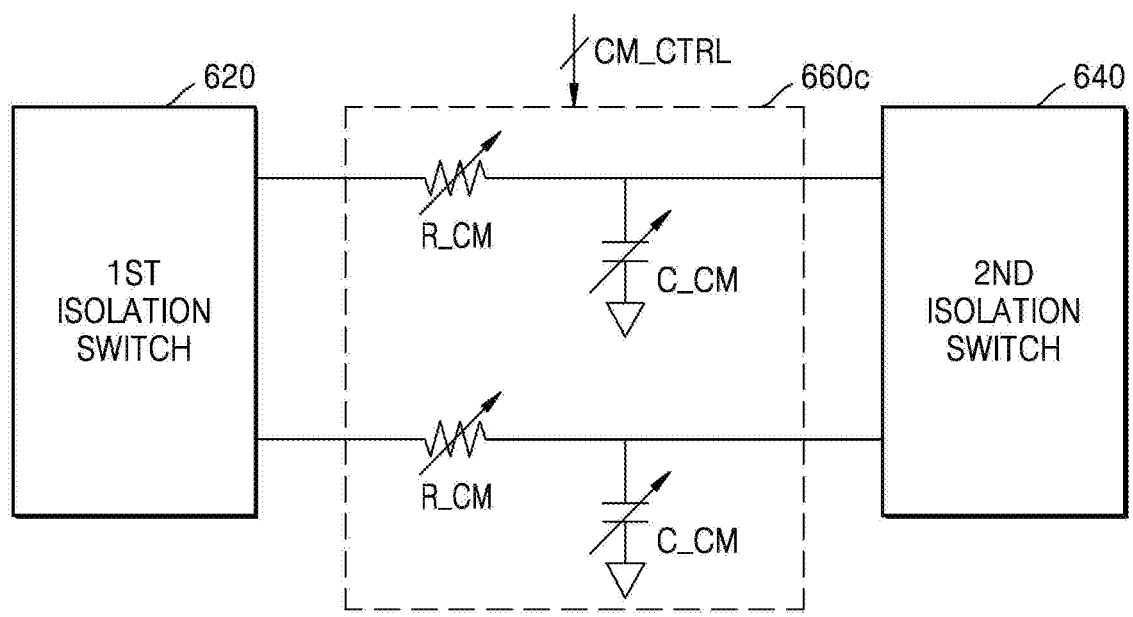
FIGS. 11A and 11B illustrate exemplary structures of a channel model circuit of FIG. 7 according to exemplary embodiments.
Figure 11B:
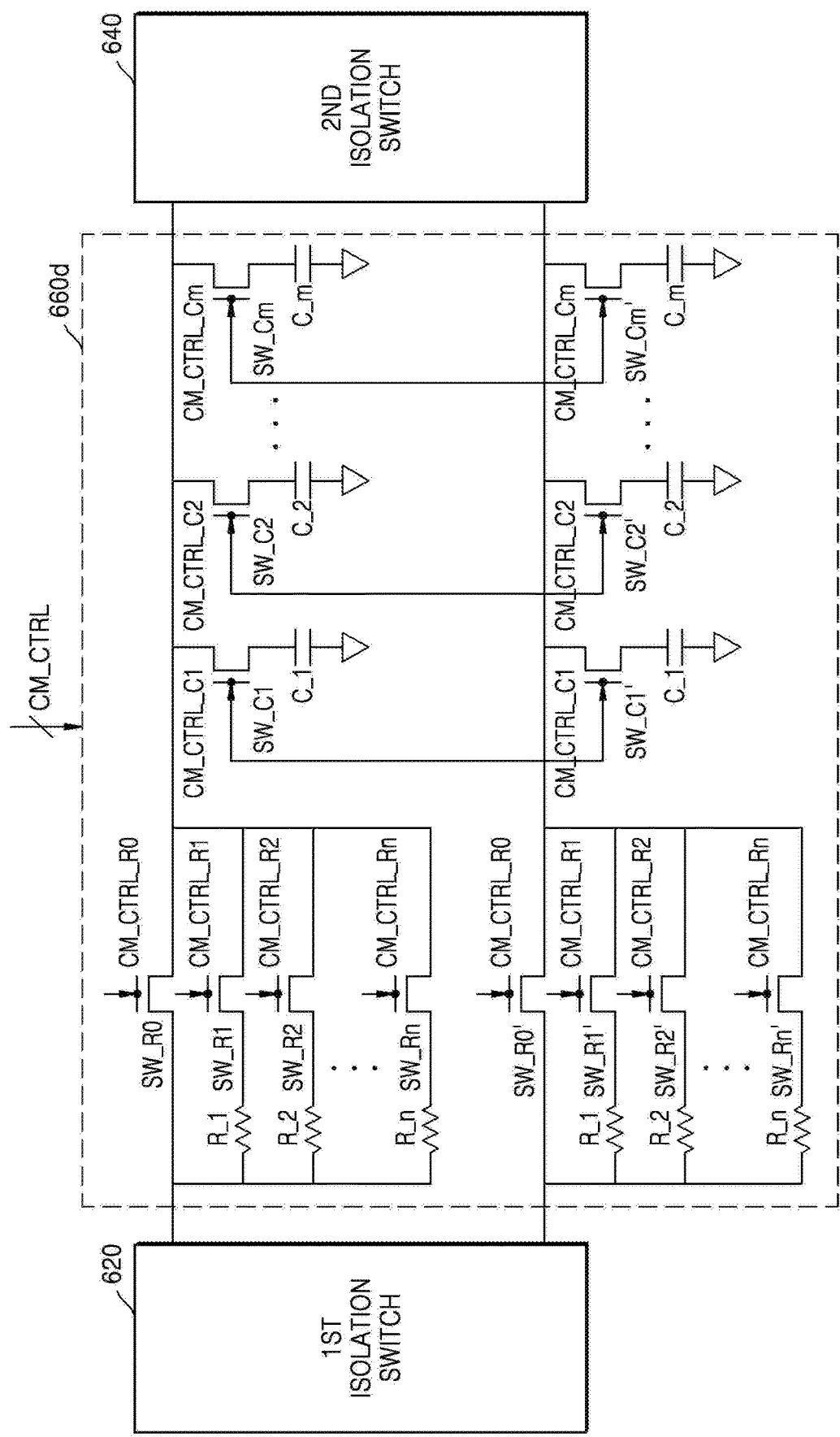

FIGS. 11A and 11B illustrate exemplary structures of the channel model circuit 660 of FIG. 7 according to exemplary embodiments. FIG. 11A shows a channel model circuit 660c including an equivalent circuit of a channel model. FIG. 11B shows an channel model circuit 660d which is specifically implemented from the channel model circuit 660c by using passive elements and switches.

Referring to FIG. 11A, the channel model circuit 660c may include a variable resistor R_CM connected to an external loopback path of each of two signal lines and a variable capacitor C_CM connected between one end of the variable resistor R_CM and the ground. A value of the variable resistor R_CM and a value of the variable capacitor C_CM may be changed based on the channel model control signal CM_CTRL.

Referring to FIG. 11B, the channel model circuit 660d may include n (n is a natural number of 1 or more) resistors R_1 to R_n connected in parallel to the external loopback path of each of two signal lines, a plurality of switches SW_R1 to SW_Rn connected to one ends of the resistors R_1 to R_n, respectively, a switch SW_R0 connected to the first and second isolation switches 620 and 640, m (m is a natural number of 1 or more) capacitors C_1 to C_m connected between the external loopback path of each of the two signal lines and the ground, and a plurality of switches SW_C1 to SW_Cm connected to one ends of the capacitors C_1 to C_m, respectively. Each of the plurality of switches SW_R1 to SW_Rn connected to the resistors R_1 to R_n may include or exclude each of the resistors R_1 to R_n respectively connected to the plurality of switches SW_R1 to SW_Rn in the external loopback path according to the channel model control signal CM_CTRL. Each of the plurality of switches SW_1 to SW_m connected to the capacitors C_1 to C_m may include or exclude each of the capacitors C_1 to C_m respectively connected to the plurality of switches SW_1 to SW_m in the external loopback path according to the channel model control signal CM_CTRL. Values of the resistors R_1 to R_n may be the same, may some be the same, or may all be different. Values of the capacitors C_1 to C_m may be the same, may some be the same, or may all be different.

The channel model control signal CM_CTRL may include a channel model resistance switch control signal CM_CTRL_R0 that determines whether to turn on or off the switch SW_R0 connected to the first and second isolation switches 620 and 640 and channel model resistance switch control signals CM_CTRL_R1 to CM_CTRL_Rn that determine wheter to turn on or turn off the switches SW_R1 to SW_Rn connected to the respective resistors. Also, the channel model control signal CM_CTRL may include channel model capacitor switch control signals CM_CTRL_C1 to CM_CTRL_Cm that determine whether to turn on or off the switches SW_C1 to SW_Cm connected to the respective capacitors. Thus, referring to FIG. 11B, the channel model circuit 660d may form an external loopback path including a channel model having a symmetric structure on both signal lines.

To check a specific operation of the channel model, it is assumed that when a '1' signal is input to each of the switches SW_R0 to SW_Rn as each of the channel model resistance switch control signals CM_CTRL_R0 to CM_CTRL_Rn, and input to each of the switches SW_C1 to SW_Cm as each of the channel model capacitance switch control signals CM_CTRL_C1 to CM_CTRL_Cm, each switch is turned on and, when a '0' signal is input instead, each switch is turned off. If 1, 0, . . . , 0 signals are input to the switches SW_R0 to SW_Rn as the respective channel model resistance switch control signals CM_CTRL_R0, CM_CTRL_R1, . . . , CM_CTRL_Rn, and 0, . . . , 0 signals are input to the switches SW_C1 to SW_Cm as the respective channel model capacitor switch control signals CM_CTRL_C1, . . . , CM_CTRL_Cm, the first isolation switch 620 and the second isolation switch 640 may be substantially connected to each other by a conductive line. As another example, if n is a natural number of 3 or more and 0, 1, 1, 0, . . . , 0 signals are input to the switches SW_R0 to SW_Rn as the respective channel model resistance switch control signals CM_CTRL_R0, CM_CTRL_R1, CM_CTRL_R2, CM_CTRL_R3, . . . , CM_CTRL_Rn, and the 0, . . . , 0 signals are input to the switches SW_C1 to SW_Cm as the respective channel model capacitor switch control signals CM_CTRL_C1, . . . , CM_CTRL_Cm, the resistor R_1 and the resistor R_2 may be connected in parallel between the first isolation switch 620 and the second isolation switch 640. As another example, if the 1, 0, . . . , 0 signals are input to the switches SW_R0 to SW_Rn as the respective channel model resistance switch control signals CM_CTRL_R0, CM_CTRL_R1, . . . , CM_CTRL_Rn, m is a natural number of 3 or more, and 1, 1, 0, . . . , 0 signals are input to the switches SW_C1 to SW_Cm as the respective channel model capacitor switch control signals CM_CTRL_C_1, CM_CTRL_C2, CM_CTRL_C3, . . . , CM_CTRL_Cm, the capacitor C_1 and the capacitor C_2 may be connected in parallel between the conducting line that connects the first isolation switch 620 and the second isolation switch 640 and the ground. As another example, if n is a natural number of 2 or more and the 0, 1, 0, . . . , 0 signals are input to the switches SW_R0 to SW_Rn as the respective channel model resistance switch control signals CM_CTRL_R0, CM_CTRL_R1, CM_CTRL_R2, . . . , CM_CTRL_Rn, m is a natural number of 2 or more, and the 1, 0, . . . , 0 signals are input to the switches SW_C1 to SW_Cm as the respective channel model capacitor switch control signals CM_CTRL_C1, CM_CTRL_C2, . . . , CM_CTRL_Cm, the resistor R_1 may be connected between the first isolation switch 620 and the second isolation switch 640, and the capacitor C_1 may be connected between one end of the resistor R_1 and the ground. In this way, the channel model circuit 660d may provide one of the plurality of channel models through a combination of the respective channel model switch control signals CM_CTRL_R0 to CM_CTRL_Rn and CM_CTRL_C1 to CM_CTRL_Cm.

Figure 12:
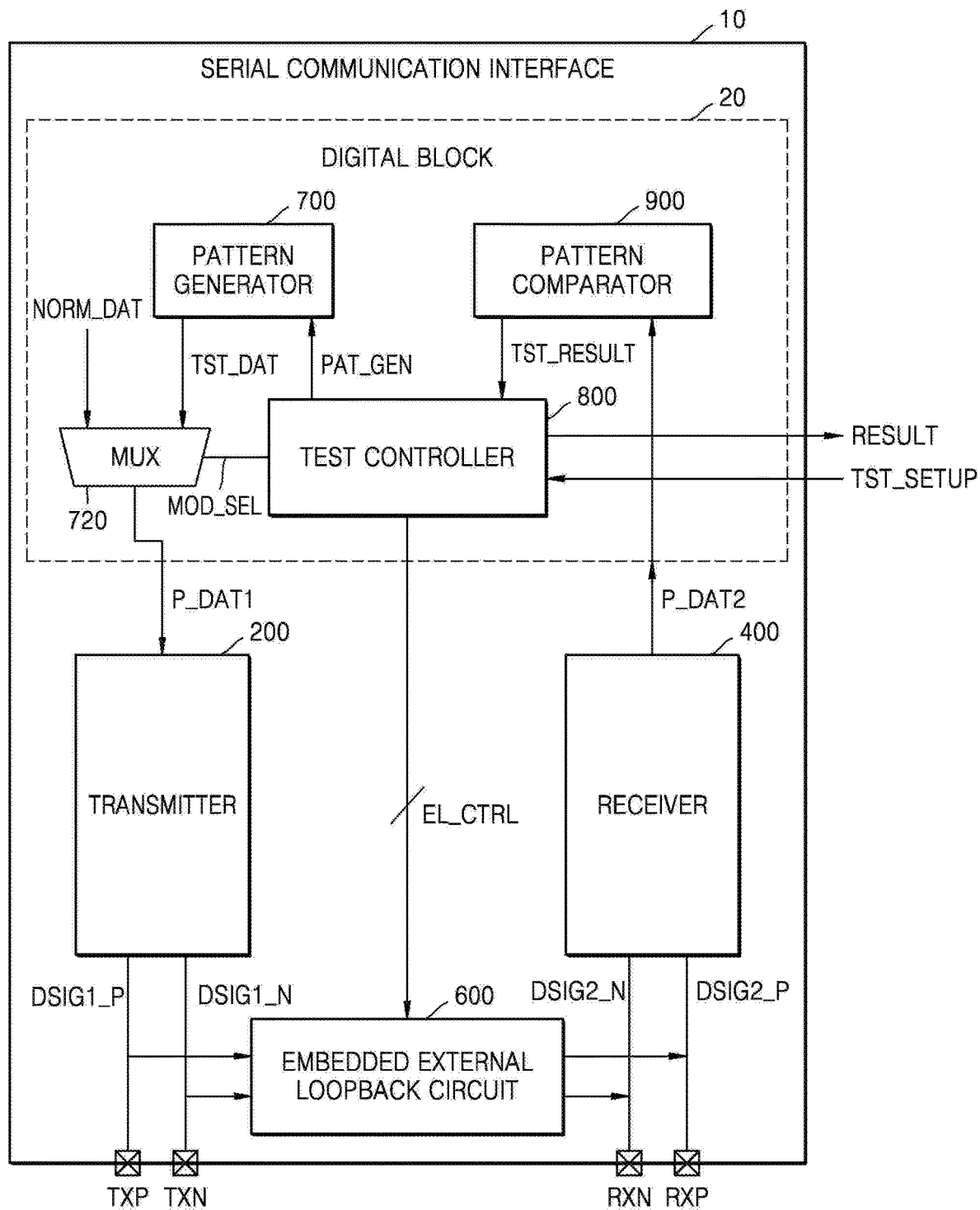
FIG. 12 illustrates a serial communication interface circuit according to an exemplary embodiment.

FIG. 12 illustrates the serial communication interface circuit 10 according to an exemplary embodiment.

The serial communication interface circuit 10 may include the transmitter 200, the receiver 400, the embedded external loopback circuit 600, and the test controller 800, similar to FIG. 5, and may include a pattern generator 700 and a pattern comparator 900. The pattern generator 700 and the pattern comparator 900 may be included in the digital block 20 of the serial communication interface circuit 10 together with the test controller 800. Descriptions of FIG. 12 that are redundant with the descriptions of FIGS. 1 and 5 will be omitted.

The serial communication interface circuit 10 may be set to a normal mode or a test mode based on a test setting signal TST_SETUP. The test mode of the serial communication interface circuit 10 may be set in an electrical die sorting (EDS) step or may be set after packaging is completed. When the serial communication interface circuit 10 operates in a variety of modes, the digital block 20 may further include a multiplexer MUX 720 in order to differentiate the first parallel data P_DAT1 that the digital block 20 transmits to the transmitter 200 for each mode from other signals. The multiplexer 720 may receive normal mode data NORM_DAT and test mode data TST_DAT. One of the normal mode data NORM_DAT and the test mode data TST_DAT may be selected by a mode selection signal MOD_SEL to be the first parallel data P_DAT1. The mode selection signal MOD_SEL may be generated by the test controller 800. Specifically, in the normal mode, the normal mode data NORM_DAT may be transmitted as the first parallel data P_DAT1 to the transmitter 200 by the mode selection signal MOD_SEL, and in the test mode, the test mode data TST_DAT may be transmitted to the transmitter 200 as the first parallel data P_DAT1 by the mode selection signal MOD_SEL.

The pattern generator 700 may determine a test pattern in response to a pattern generation signal PAT_GEN transmitted from the test controller 800, and may generate the test mode data TST_DAT in a parallel data format based on the test pattern. The generated test mode data TST_DAT may also be transmitted to the pattern comparator 900 as well.

In the test mode, the generated test mode data TST_DAT may be transmitted to the transmitter 200 as the first parallel data P_DAT1. The transmitter 200 may convert the first parallel data P_DAT1 into the first serial data S_DAT1 and output the first serial data S_DAT1 as the first differential signals DSIG1_P and DSIG1_N through the differential output ports TXP and TXN. The first differential signals DSIG1_P and DSIG1_N may be converted into the second differential signals DSIG2_P and DSIG2_N via the embedded external loopback circuit 600. The second serial data S_DAT2 may be input to the receiver 400 as the second parallel data P_DAT2 through the differential input ports RXP and RXN and converted into the second parallel data P_DAT2.

The pattern comparator 900 may generate a test result signal TST_RESULT by comparing the second parallel data P_DAT2 input in the test mode with the test mode data TST_DAT. The test result signal TST_RESULT may be transmitted to the test controller 800. The test controller 800 may send a final result signal RESULT to the outside of the serial communication interface circuit 10 based on the test result signal TST_RESULT.

Figure 13:
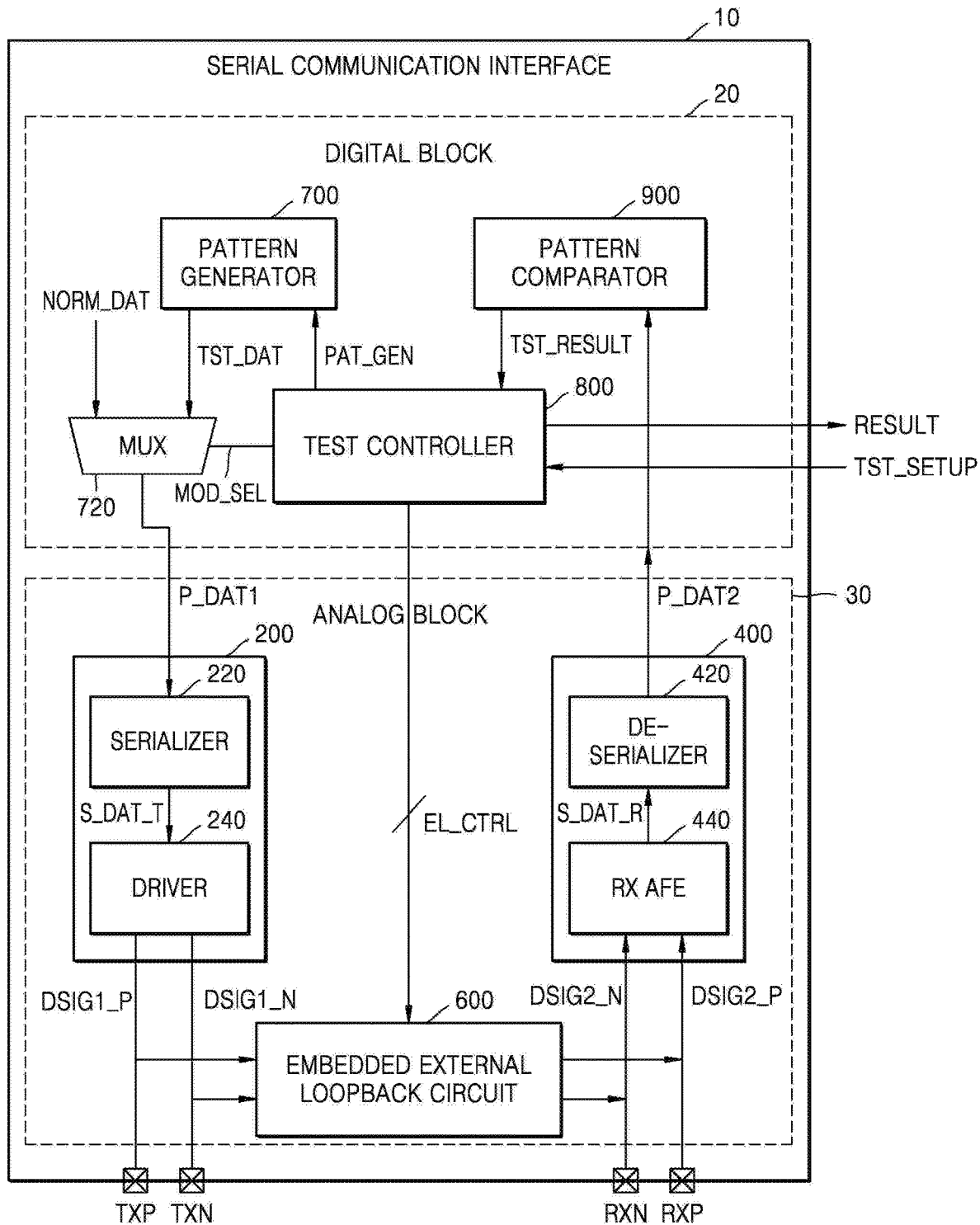
FIG. 13 illustrates a serial communication interface circuit according to an exemplary embodiment.

FIG. 13 illustrates the serial communication interface circuit 10 according to an exemplary embodiment.

The serial communication interface circuit 10 may include the transmitter 200, the receiver 400, the embedded external loopback circuit 600, the test controller 800, the pattern generator 700, and the pattern comparator 900, similar to FIG. 12. The transmitter 200 may include a serializer 220 and a driver 240. The receiver 400 may include a deserializer 420 and a reception analog front end (RX AFE) 440. Description of FIG. 13 that are redundant with the description of FIG. 12 will be omitted.

The serializer 220 may convert the first parallel data P_DAT1 of a parallel data format transmitted to the transmitter 200 into the transmission serial data S_DAT_T, and may transmit the transmission serial data S_DAT_T to the driver 240. The driver 240 may generate the first serial data S_DAT1 as the first differential signals DSIG1_P and DSIG1_N based on the transmission serial data S_DAT_T received from the serializer 220, and may output the first differential signals DSIG1_P and DSIG1_N through the differential output ports TXP and TXN.

The reception analog front end 440 may receive the second differential signals DSIG2_P and DSIG2_N converted from the first differential signals DSIG1_P and DSIG1_N via the embedded external loopback circuit 600 through the differential input ports RXP and RXN, and may transfer the reception serial data S_DAT_R to the deserializer 420 based on the second serial data S_DAT2 received as the second differential signals DSIG2_P and DSIG2_N. The deserializer 420 may convert the reception serial data S_DAT_R received from the reception analog front end 440 into second parallel data P_DAT2 of a parallel data format.

Referring to FIG. 13, the serial communication interface circuit 10 may include the digital block 20 and an analog block 30. The digital block 20 may be referred to as a digital circuit region 20. The analog block 30 may be referred to as an analog circuit region 30. The digital block 20 may include the test controller 800, the pattern generator 700 and the pattern comparator 900. The analog block 30 may include the transmitter 200, the receiver 400 and the embedded external loopback circuit 600.

Figure 14:
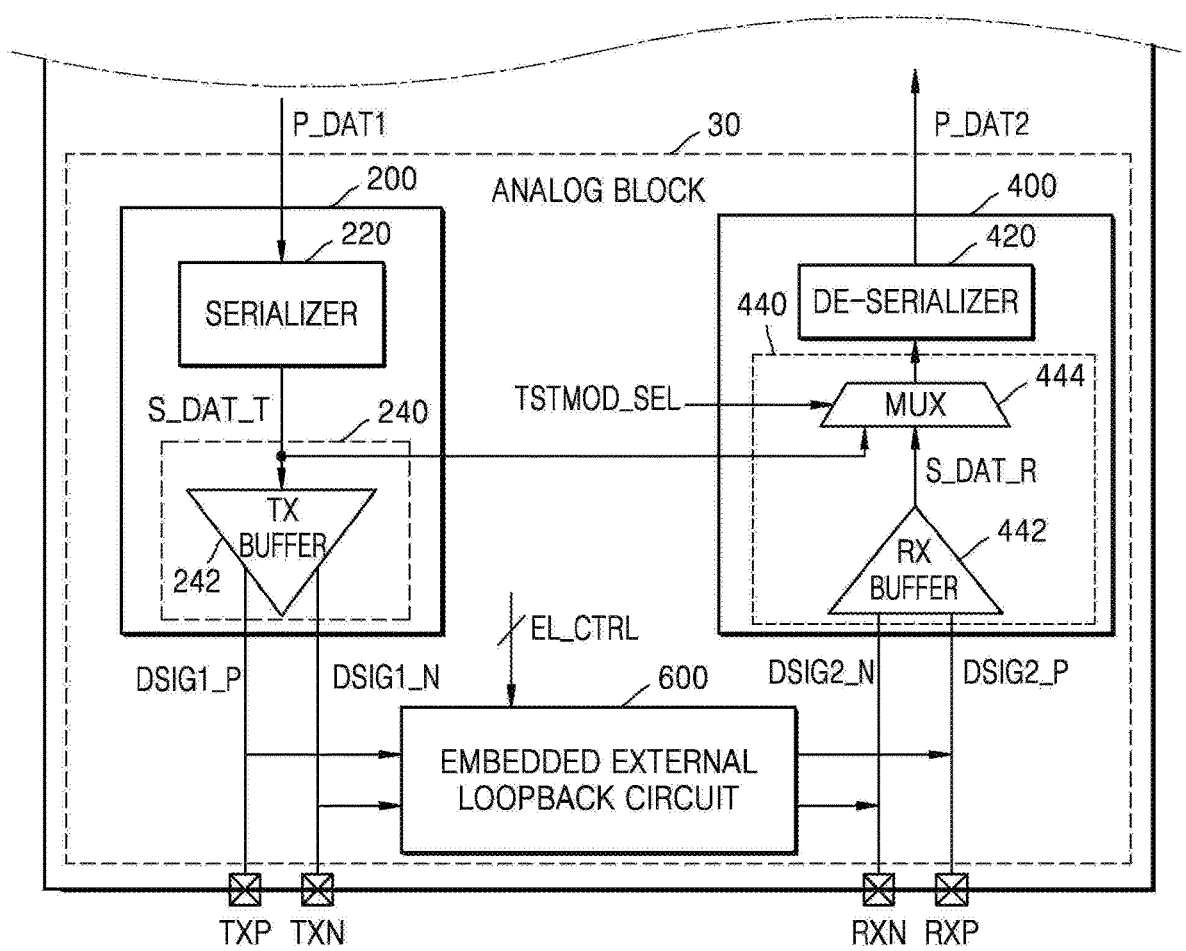
FIG. 14 is an exemplary block diagram of an analog block of FIG. 13 according to an embodiment.

FIG. 14 is an exemplary block diagram of the analog block 30 of FIG. 13 according to an embodiment. As described with reference to FIG. 13, the analog block 30 may include the transmitter 200, the receiver 400 and the embedded external loopback circuit 600. The transmitter 200 may include the serializer 220 and the driver 240. The receiver 400 may include the deserializer 420 and the reception analog front end 440.

Referring to FIG. 14, the driver 240 may include a TX buffer 242. The TX buffer 242 may receive the transmission serial data S_DAT_T converted by the serializer 220, and may output the first serial data S_DAT1 generated based on the transmission serial data S_DAT_T as the first differential signal DSIG1_P, DSIG1_N via the differential output ports TXP, TXN.

The reception analog front end 440 may include a RX buffer 442 and a multiplexer MUX 444. The RX buffer 442 may receive the second serial data S_DAT2 as the second differential signals DSIG2_P and DSIG2_N through the differential input ports RXP and RXN, and may transmit the reception serial data S_DAT_R to the multiplexer 444 based on the second serial data S_DAT2.

The multiplexer 444 may receive the transmission serial data S_DAT_T and the reception serial data S_DAT_R. One of the transmission serial data S_DAT_T and the reception serial data S_DAT_R may be selected by the test mode selection signal TSTMOD_SEL and input to the deserializer 420.

In a normal mode, the multiplexer 444 may transfer the reception serial data S_DAT_R to the deserializer 420 based on the test mode select signal TSTMOD_SEL so that the deserializer 420 receives an external signal.

A test mode may be divided into a first test mode for testing a circuit through an internal loopback path without an analog signal step, and a second test mode for testing the circuit via an external loopback path via the analog signal step. In the first test mode, the multiplexer 444 may send the transmission serial data S_DAT_T to the deserializer 420 based on the test mode select signal TSTMOD_SEL so that the deserializer 420 receives the transmission serial data S_DAT_T that does not pass through an external path. On the other hand, in the second test mode, the multiplexer 444 may send the reception serial data S_DAT_R to the deserializer 420 based on the test mode selecting signal TSTMOD_ SEL so that the deserializer 420 receives the reception serial data S_DAT_R through the external path.

Figure 15A:
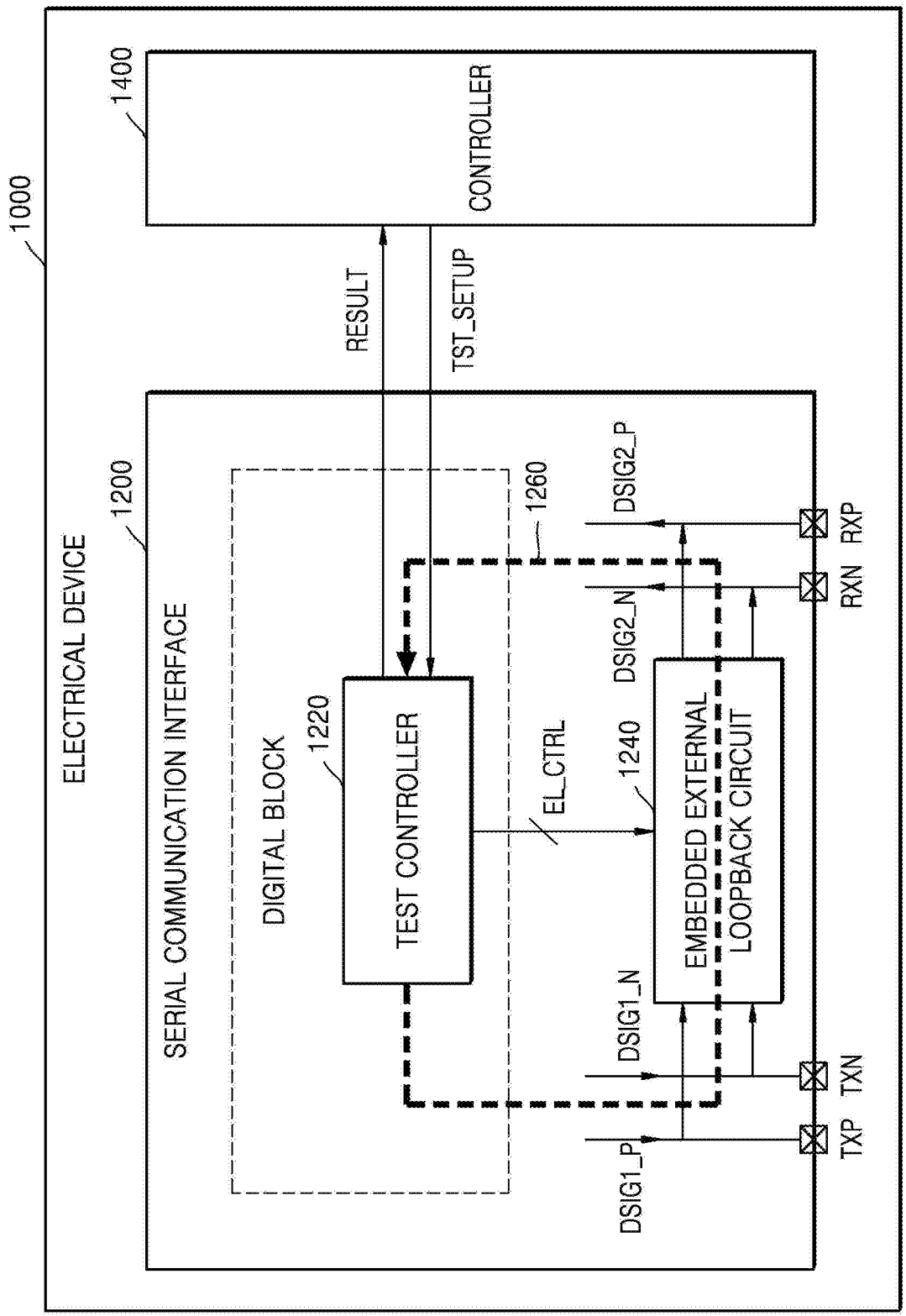
FIGS. 15A and 15B illustrate an electronic device including a serial communication interface circuit according to an exemplary embodiment.
Figure 15B:
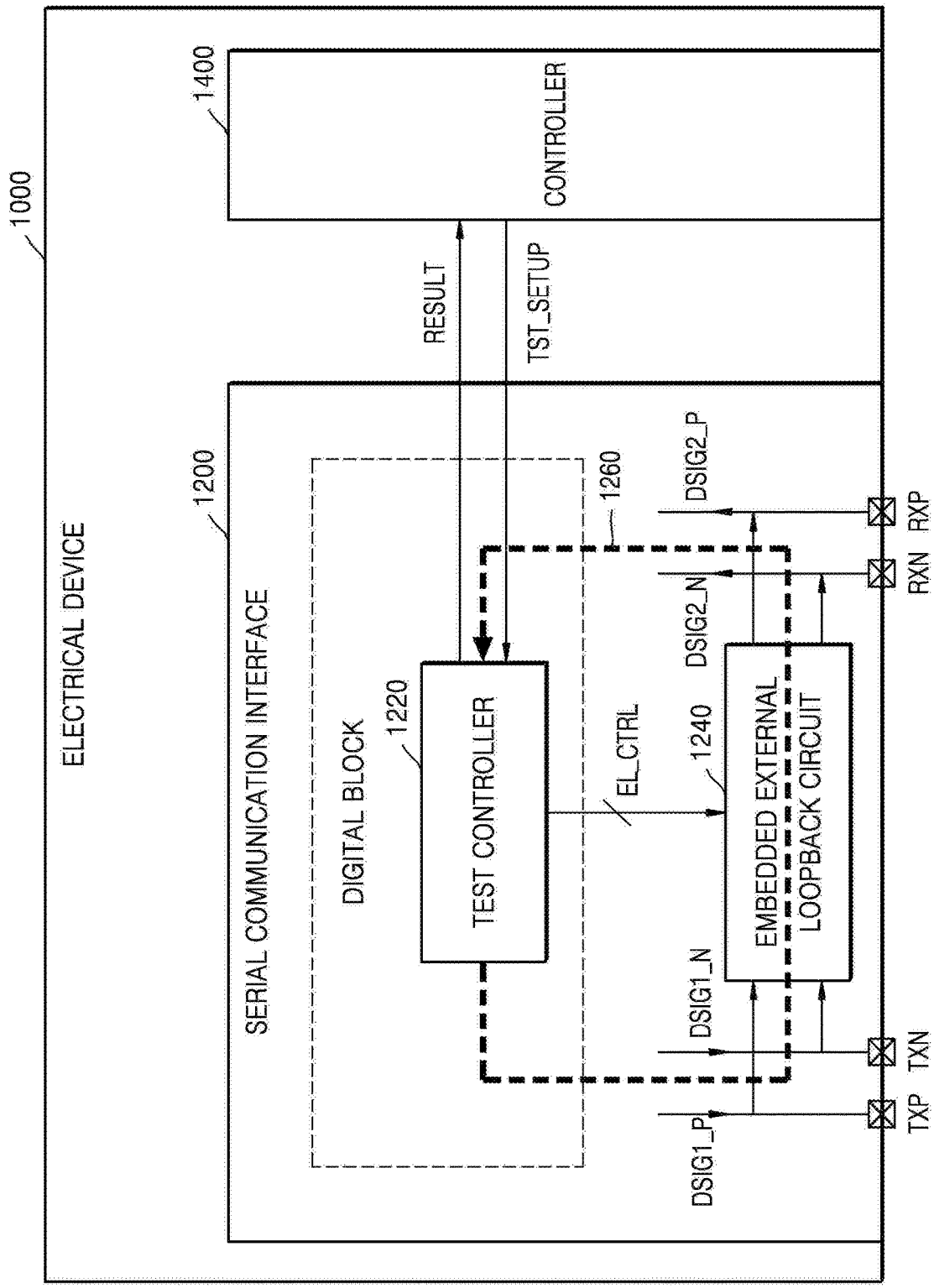

FIGS. 15A and 15B illustrate an electronic device 1000 including a serial communication interface circuit 1200 according to an exemplary embodiment. For example, the electronic device 1000 may be a data storage device such as a universal flash storage (UFS) and a solid state drive (SSD) or a semiconductor device such as an application processor (AP) and a central processing unit (CPU).

The electronic device 1000 may include the at least one serial communication interface circuit 1200 and a controller 1400. The at least one serial communication interface circuit 1200 may include an output port for outputting first serial data, an input port for receiving second serial data, a test controller 1220, and an embedded external loopback circuit 1240. The output port may be the differential output port TXP or TXN. The first serial data may be serial data output as the first differential signals DSIG1_P and DSIG1_N via the differential output ports TXP and TXN. The input port may be the differential input port RXP or RXN. The second serial data may be serial data input as the second differential signals DSIG2_P and DSIG2_N via the differential input ports RXP and RXN.

The controller 1400 may provide the test setup signal TST_SETUP to the serial communication interface circuit 1200 for testing according to a serial communication requirement of the serial communication interface circuit 1200. The serial communication interface circuit 1200 may provide the controller 1400 with the final result signal RESULT indicating a result of a test in a test mode.

The serial communication requirement may be a requirement determined according to a specification required for the serial communication interface circuit 1200, a requirement determined according to a class required for the serial communication interface circuit 1200, or a requirement determined according to other factors. For example, the specification required of the serial communication interface circuit 1200 may include a worst eye-opening condition determined according to a lowest amplitude value of the second differential signals DSIG2_P and DSIG2_N that may be processed by the differential input ports RXP and RXN. Also, for example, the class required for the serial communication interface circuit 1200 may include a class that is classified according to a degree of strictness of a test standard of the serial communication interface circuit 1200.

As a specific example of the class required for the serial communication interface circuit 1200, the class required for the serial communication interface circuit 1200 may be divided into a first class, a second class, and a third class according to the degree of strictness of the test standard. For example, the serial communication interface circuit 1200 of the first class may be the serial communication interface circuit 1200 that passed a test of a most strict standard. When testing the serial communication interface circuit 1200 according to the most strict standard, the embedded external loopback circuit 1240 may form an external loopback circuit 1260 used to make the second differential signals DSIG2_P, DSIG2_N corresponding to the worst eye-opening condition. On the other hand, the serial communication interface circuit 1200 of the third class may be the serial communication interface circuit 1200 that passed a test of a least relaxed standard. When testing the serial communication interface circuit 1200 according to the least relaxed standard, the embedded external loopback circuit 1240 may form the external loopback path 1260 used to make the second differential signals DSIG2_P, DSIG2_N having a larger amplitude than the signal corresponding to the worst eye-opening condition.

The serial communication interface circuit 1200 may include the embedded external loopback circuit 1240 that forms the external loopback path 1260. The embedded external loopback circuit 1240 may be between the differential output ports TXP and TXN and the differential input ports RXP and RXN, and may form the external loopback path 1260 in the test mode. The embedded external loopback circuit 1240 may form a path of electrical signals between the differential output ports TXP and TXN and the differential input ports RXP and RXN in the test mode based on the at least one test control signal EL_CTRL, and may block the path of electrical signals between the differential output ports TXP and TXN and the differential input ports RXP and RXN in the normal mode. Also, in the test mode, the embedded external loopback circuit 1240 may provide various channel models to the external loopback path 1260 based on the at least one test control signal EL_CTRL.

The embedded external loopback circuit 1240 may include a first isolation switch, a second isolation switch, and a channel model circuit. The first isolation switch, the second isolation switch, and the model circuit may be controlled based on the at least one test control signal EL_CTRL.

The first isolation switch of the embedded external loopback circuit 1240 may be connected to the differential output ports TXP, TXN and may be turned on in the test mode. The second isolation switch may be connected to the differential input ports RXP, RXN and may be turned on in the test mode. The channel model circuit may provide a channel model of the external loopback path 1260 in the test mode. In particular, the channel model circuit may provide one of a plurality of channel models based on the at least one test control signal EL_CTRL.

The channel model circuit of the embedded external loopback circuit 1240 may include a plurality of passive elements, and may include a plurality of switches each connected to one ends of the plurality of passive elements, respectively. Each of the plurality of switches may include or exclude a passive element connected thereto in the external loopback path 1260 according to the at least one test control signal EL_CTRL. Each of the plurality of passive elements may include a resistor, and may include a capacitor. Specifically, the plurality of passive elements may include one or more resistors connected in parallel to the external loopback path 1260. Alternatively, the plurality of passive elements may include one or more capacitors connected between the external loopback path 1260 and the ground. In addition, the embedded external loopback circuit 1240 may include one of the channel model circuits disclosed in FIGS. 10A through 10B and 11A through 11B.

Referring to FIG. 15A, the differential output ports TXP and TXN and the differential input ports RXP and RXN of the serial communication interface circuit 1200 may be present inside the electronic device 1000. Also, referring to FIG. 15B, the differential output ports TXP and TXN and the differential input ports RXP and RXN of the serial communication interface circuit 1200 may be exposed to the outside of the electronic device 1000.

Figure 16:
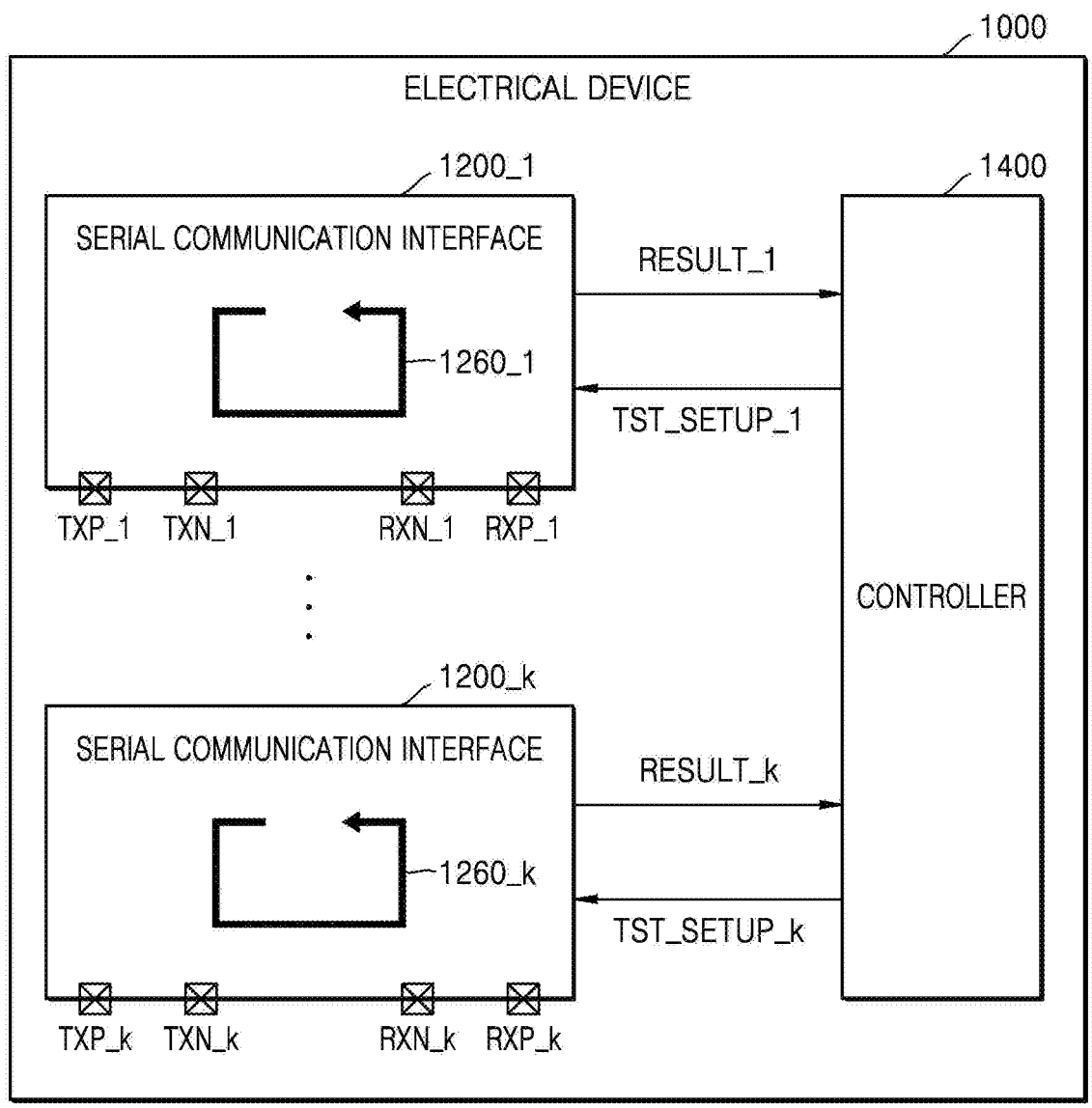
FIG. 16 illustrates an electronic device including a serial communication interface circuit according to an exemplary embodiment.

FIG. 16 illustrates the electronic device 1000 including the serial communication interface circuit 1200 according to an exemplary embodiment. The electronic device 1000 may include k (where k is a natural number of 2 or more) serial communication interface circuits 1200_1 through 1200_k, and may include the controller 1400.

The controller 1400 may respectively provide test setup signals TST_SETUP_1 to TST_SETUP_k to the serial communication interface circuits 1200_1 to 1200_k to test the respective serial communication interface circuits 1200_1 to 1200_k according to respective serial communication requirements. Each of the serial communication requirements may be a requirement determined according to a specification required for each serial communication interface circuit, a requirement determined according to a class required for each serial communication interface circuit, and a requirement determined according to other factors. Each of the serial communication interface circuits 1200_1 through 1200_k may provide the controller 1400 with the final result signals RESULT_1 through RESULT_k indicating a result of a test in a test mode.

Each of the serial communication interface circuits 1200_1 through 1200_k may include an embedded external loopback circuit that forms external loopback paths 1260_1 through 1260_k. Descriptions of a configuration and an operation of the embedded external loopback circuit will be understood to be the same as described with reference to FIGS. 3, 7, and 9A through 11B.

In addition, each of the serial communication interface circuits 1200_1 to 1200_k may further include a transmitter, a receiver, a pattern generator, and a pattern comparator similar to those described with reference to FIG. 12, which will be understood to be the same as described with reference to FIG. 12.

Figure 17:
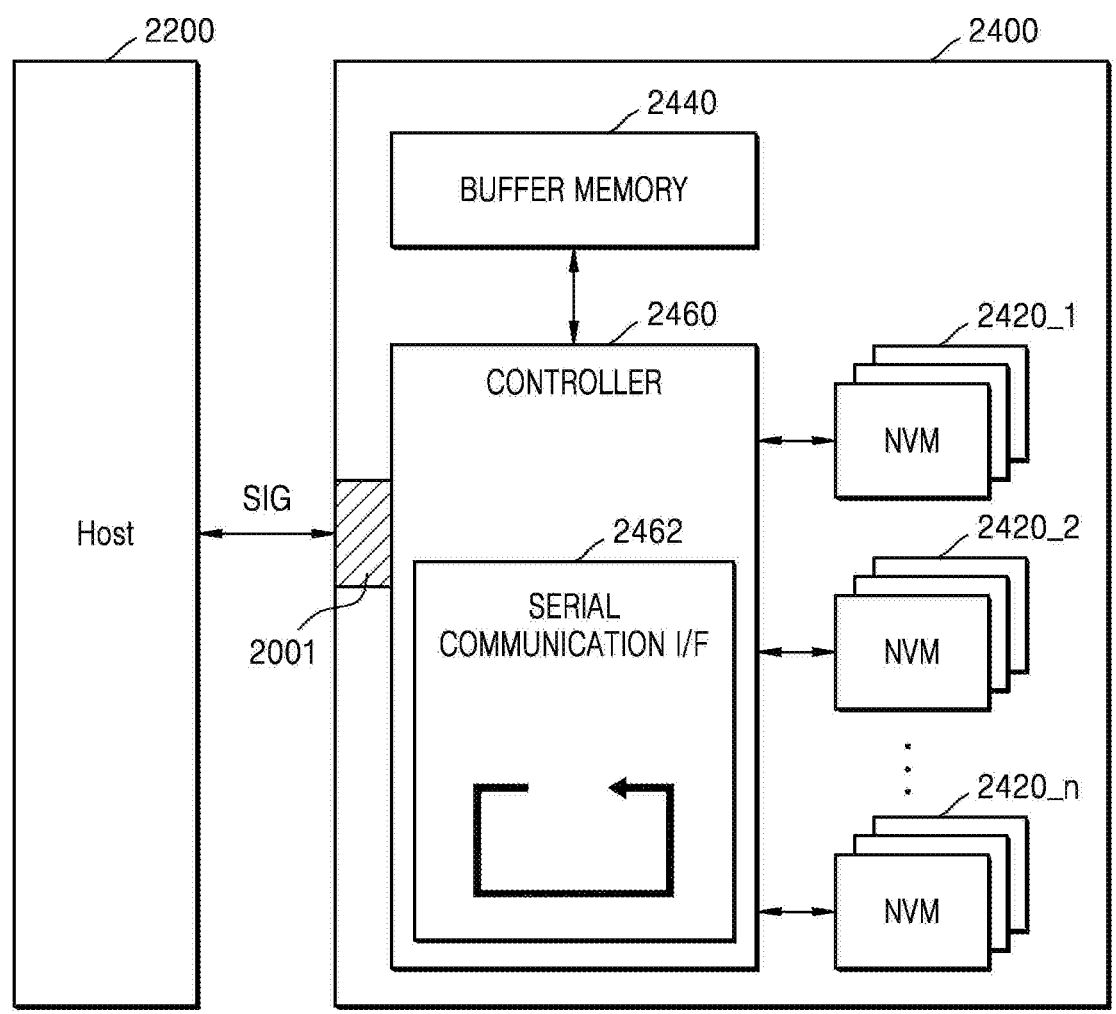
FIG. 17 is an exemplary block diagram illustrating a system including a serial communication interface circuit according to an exemplary embodiment.

FIG. 17 is an exemplary block diagram illustrating a system 2000 including a serial communication interface circuit 2462 according to an exemplary embodiment.

Referring to FIG. 17, the system 2000 may include a host 2200 and a storage device 2400. The storage device 2400 may be referred to as a memory system or a storage system and may include a signal connector 2001, a plurality of non-volatile memories 2420_1 to 2420_n, a buffer memory 2440, and a controller 2460. For example, the controller 2460 may be referred to as a memory controller or a storage controller.

The storage device 2400 may transmit and receive a signal SIG to and from the host 2200 via the signal connector 2001. The host 2200 and the storage device 2400 may communicate via an electrical signal and/or an optical signal and may communicate through, as non-limited examples, Universal Flash Storage (UFS), Serial Advanced Technology Attachment (SATA), SATAe (SATA express), Small Computer Small Interfaces (SCSI), Serial Attached SCSI (SAS), Peripheral Component Interconnect express (PCIe), Non-Volatile Memory Express (NVMe), and Advanced Host Controller Interface (AHCI) or a combination thereof.

The controller 2460 may control the plurality of nonvolatile memories 2420_1 to 2420_n in response to the signal SIG received from the host 2200. The controller 2460 may include the serial communication interface circuit 2462 for data transmission and reception. The serial communication interface circuit 2462 may include an embedded external loopback circuit that forms an external loopback path in a test mode. For example, the serial communication interface circuit 2462 may provide a communication interface such as UFS, SATA, SATAe, SCSI, SAS, PCIe, NVMe, AHCI, etc. and simultaneously may include an embedded external loopback that forms an external loopback path in the communication interface. The buffer memory 2440 may operate as a buffer memory of the storage device 2400.

Each of the non-volatile memories 2420_1 through 2420_n may include a memory cell array. The memory cell array may include memory blocks, each of which may be divided into pages, each of which may be non-volatile memory cells, e.g., at least one NAND flash memory cell.

The operations or steps of the methods or algorithms described above can be embodied as computer readable codes on a computer readable recording medium, or to be transmitted through a transmission medium. The computer readable recording medium is any data storage device that can store data which can be thereafter read by a computer system. Examples of the computer readable recording medium include read-only memory (ROM), random-access memory (RAM), compact disc (CD)-ROM, digital versatile disc (DVD), magnetic tape, floppy disk, and optical data storage device, not being limited thereto. The transmission medium can include carrier waves transmitted through the Internet or various types of communication channel. The computer readable recording medium can also be distributed over network coupled computer systems so that the computer readable code is stored and executed in a distributed fashion.

At least one of the components, elements, modules or units represented by a block as illustrated in the drawings may be embodied as various numbers of hardware, software and/or firmware structures that execute respective functions described above, according to an exemplary embodiment. For example, at least one of these components, elements, modules or units may use a direct circuit structure, such as a memory, a processor, a logic circuit, a look-up table, etc. that may execute the respective functions through controls of one or more microprocessors or other control apparatuses. Also, at least one of these components, elements, modules or units may be specifically embodied by a module, a program, or a part of code, which contains one or more executable instructions for performing specified logic functions, and executed by one or more microprocessors or other control apparatuses. Also, at least one of these components, elements, modules or units may further include or may be implemented by a processor such as a central processing unit (CPU) that performs the respective functions, a microprocessor, or the like. Two or more of these components, elements, modules or units may be combined into one single component, element, module or unit which performs all operations or functions of the combined two or more components, elements, modules or units. Also, at least part of functions of at least one of these components, elements, modules or units may be performed by another of these components, elements, modules or units. Further, although a bus is not illustrated in the above block diagrams, communication between the components, elements, modules or units may be performed through the bus. Functional aspects of the above exemplary embodiments may be implemented in algorithms that execute on one or more processors. Furthermore, the components, elements, modules or units represented by a block or processing steps may employ any number of related art techniques for electronics configuration, signal processing and/or control, data processing and the like.

While the inventive concept has been particularly shown and described with reference to exemplary embodiments thereof, it will be understood that various changes in form and details may be made therein without departing from the spirit and scope of the inventive concept.

What is claimed is:

1. A serial communication interface circuit comprising:
   a transmitter configured to convert first parallel data into first serial data, and transmit the first serial data through an output port;
   a receiver configured to receive second serial data through an input port, and convert the second serial data into second parallel data;
   a test controller circuit configured to generate at least one test control signal; and
   an embedded external loopback circuit configured to form an external loopback path between the output port and the input port to receive the first serial data and output the second serial data according to at least one channel model provided in response to the at least one test control signal in a test mode.

2. The serial communication interface circuit of claim 1, wherein the embedded external loopback circuit comprises:
   a first isolation switch connected to the output port, and configured to be turned on in the test mode;
   a second isolation switch connected to the input port, and configured to be turned on in the test mode; and
   a channel model circuit connected to the first isolation switch and the second isolation switch, and configured to provide the at least one channel model.

3. The serial communication interface circuit of claim 2, wherein the channel model circuit provides one of a plurality of channel models selected based on the at least one test control signal, and
   wherein, according to the selected one of the plurality of channel models, a level of the first serial data is differently changed when the first serial data is changed to the second serial data between the output port and the input port.

4. The serial communication interface circuit of claim 3, wherein the test controller circuit generates the at least one test control signal such that the channel model circuit provides one of the plurality of channel models, in response to a test setup signal received from outside of the serial communication interface circuit.

5. The serial communication interface circuit of claim 2, wherein the channel model circuit comprises:
   a plurality of passive elements; and
   a plurality of switches respectively connected to one ends of the plurality of passive elements,
   wherein each of the plurality of switches determines whether a passive element connected thereto is included in or excluded from the external loopback path according to the at least one test control signal.

6. The serial communication interface circuit of claim 5, wherein the plurality of passive elements comprise at least one resistor connected in parallel to the external loopback path.

7. The serial communication interface circuit of claim 5, wherein the plurality of passive elements comprise at least one capacitor connected between the external loopback path and a ground.

8. The serial communication interface circuit of claim 1, further comprising:
   a pattern generator circuit configured to generate the first parallel data based on a test pattern and provide the first parallel data to the transmitter in the test mode; and
   a pattern comparator circuit configured to generate a test result signal by comparing the first parallel data generated based on the test pattern with the second parallel data in the test mode.

9. The serial communication interface circuit of claim 8, wherein the serial communication interface circuit comprises a digital block and an analog block,
   wherein the test controller circuit, the pattern generator circuit, and the pattern comparator circuit are included in the digital block, and
   wherein the transmitter, the receiver, and the embedded external loopback circuit are included in the analog block.

10. The serial communication interface circuit of claim 1, wherein the output port is a differential output port,
    wherein the transmitter comprises a driver which outputs the first serial data as a first differential signal through the differential output port,
    wherein the input port is a differential input port,
    wherein the receiver comprises a reception analog front end which receives the second serial data as a second differential signal through the differential input port, and
    wherein the embedded external loopback circuit forms an external loopback path comprising a channel model having a symmetric structure in both signal lines of the first differential signal and the second differential signal.

11. The serial communication interface circuit of claim 1, wherein the embedded external loopback circuit comprises a channel model circuit providing a plurality of channel models, and
wherein each of the plurality of channel models provides a reduced direct current (DC) level or an alternating current (AC) level when the first serial data is changed to the second serial data between the output port and the input port.

12. An electronic device comprising:
at least one serial communication interface circuit; and
a controller circuit configured to provide a test setup signal to the at least one serial communication interface circuit in order to test the at least one serial communication interface circuit according to a serial communication requirement of the at least one serial communication interface circuit,
wherein the at least one serial communication interface circuit comprises:
an output port configured to output first serial data;
an input port configured to receive second serial data;
a test controller circuit configured to generate at least one test control signal in response to the test setup signal; and
an embedded external loopback circuit configured to form an external loopback path between the output port and the input port to receive the first serial data and output the second serial data according to at least one channel model provided in response to the at least one test control signal in a test mode.

13. The electronic device of claim 12, wherein the embedded external loopback circuit comprises:
a first isolation switch connected to the output port, and configured to be turned on in the test mode;
a second isolation switch connected to the input port, and configured to be turned on in the test mode; and
a channel model circuit connected to the first isolation switch and the second isolation switch, and configured to provide the at least one channel model.

14. The electronic device of claim 13, wherein the channel model circuit comprises:
a plurality of passive elements; and
a plurality of switches respectively connected to one ends of the plurality of passive elements,
wherein each of the plurality of switches determines whether a passive element connected thereto is included in or excluded from the external loopback path according to the at least one test control signal.

15. The electronic device of claim 12, wherein the embedded external loopback circuit comprises a channel model circuit providing a plurality of channel models, and
wherein each of the channel models provides a reduced level or an alternating current (AC) level when the first serial data is changed to the second serial data between the output port and the input port.

16. The electronic device of claim 12, wherein the serial communication requirement is a requirement determined according to a specification of the at least one serial communication interface circuit or a class required for the at least one serial communication interface circuit.

17. A serial communication interface circuit comprising:
a digital circuit configured to generate and output at least one test control signal in a test mode of the serial communication interface circuit; and
an analog circuit comprising an output port which transmits first serial data, an input port which receives second serial data, and an embedded external loopback circuit connected between the output port and the input port,
wherein the embedded external loopback circuit receives the first serial data in the test mode, and outputs an attenuated signal from a signal of the first serial data as the second serial data based on the at least one test control signal.

18. The serial communication interface circuit of claim 17, wherein the digital circuit generates a final result signal by comparing first parallel data corresponding to the first serial data with second parallel data corresponding to the second serial data in the test mode, and outputs the final result signal to the outside of the serial communication interface circuit.

19. The serial communication interface circuit of claim 17, wherein the embedded external loopback circuit comprises a plurality of passive elements for attenuating the signal of the first serial data.

20. The serial communication interface circuit of claim 17, wherein the serial communication interface circuit transmits the first serial data and receives the second serial data according to a universal flash storage (UFS) standard protocol.

* * * * *